United States Patent
Bonkohara et al.

(10) Patent No.: US 9,282,638 B2
(45) Date of Patent: Mar. 8, 2016

(54) ELECTRODE, ELECTRODE MATERIAL, AND ELECTRODE FORMATION METHOD

(71) Applicant: ZyCube Co., Ltd., Kanagawa (JP)

(72) Inventors: Manabu Bonkohara, Kanagawa (JP); Hirofumi Nakamura, Kanagawa (JP); Qiwei He, Kanagawa (JP)

(73) Assignee: ZYCUBE CO., LTD., Tokyo (JP)

( * ) Notice: Subject to any disclaimer, the term of this patent is extended or adjusted under 35 U.S.C. 154(b) by 0 days.

(21) Appl. No.: 13/949,924

(22) Filed: Jul. 24, 2013

(65) Prior Publication Data
US 2014/0034354 A1 Feb. 6, 2014

Related U.S. Application Data

(63) Continuation-in-part of application No. 13/740,688, filed on Jan. 14, 2013, now abandoned.

(30) Foreign Application Priority Data

Jan. 13, 2012 (JP) ................................. 2012-005698

(51) Int. Cl.
| | |
|---|---|
| *H05K 1/09* | (2006.01) |
| *H05K 3/00* | (2006.01) |
| *H01L 21/768* | (2006.01) |
| *H01L 23/482* | (2006.01) |
| *H01L 23/48* | (2006.01) |

(Continued)

(52) U.S. Cl.
CPC ............ *H05K 1/09* (2013.01); *H01L 21/76855* (2013.01); *H01L 21/76898* (2013.01); *H01L 23/481* (2013.01); *H01L 23/4828* (2013.01); *H01L 23/49827* (2013.01); *H01L 23/49866* (2013.01); *H01L 23/53257* (2013.01); *H05K 3/00* (2013.01); *H01L 2924/0002* (2013.01)

(58) Field of Classification Search
CPC ............ H01L 21/76855; H01L 23/481; H01L 23/4828; H05K 1/092
USPC ........... 438/667; 977/779, 784; 257/746, 750, 257/E23.011
See application file for complete search history.

(56) References Cited

U.S. PATENT DOCUMENTS

| | | | | |
|---|---|---|---|---|
| 3,255,393 | A * | 6/1966 | Douglas et al. ............... | 257/485 |
| 3,767,519 | A * | 10/1973 | Kojima et al. ................ | 428/328 |
| 6,219,223 | B1 * | 4/2001 | Kobayashi et al. ........... | 361/525 |

(Continued)

FOREIGN PATENT DOCUMENTS

| | | |
|---|---|---|
| JP | 2009-277927 A | 11/2009 |
| JP | 2011-054907 A | 3/2011 |
| JP | 2011-071153 A | 4/2011 |

*Primary Examiner* — Bac Au
*Assistant Examiner* — Toniae Thomas
(74) *Attorney, Agent, or Firm* — Westerman, Hattori, Daniels & Adrian, LLP

(57) ABSTRACT

A method of forming a low-resistance, high-reliability through/embedded electrode is provided, where the electrode can be arranged in a higher density according to the miniaturization of the semiconductor manufacturing technology. This method includes the step of filling an opening 51 of a substrate 50 with a paste 56 of a first conductive material and drying the paste 56; the step of solid-phase sintering the paste 56 filled in the opening 51, generating a first porous conductor 57; the step of applying a paste of a second conductive material so as to cover the first conductor 57; and the step of melting the paste of the second conductive material by heat treatment, impregnating the second conductive material into the first conductor 57.

6 Claims, 15 Drawing Sheets

(51) Int. Cl.
*H01L 23/498* (2006.01)
*H01L 23/532* (2006.01)

(56) References Cited

U.S. PATENT DOCUMENTS

| | | | |
|---|---|---|---|
| 6,252,481 B1* | 6/2001 | Iwao et al. ................... 336/83 |
| 6,823,915 B2* | 11/2004 | Schwarzbauer .............. 156/349 |
| 8,314,484 B2* | 11/2012 | Kajiwara et al. .............. 257/705 |
| 2001/0025415 A1* | 10/2001 | Kawamoto et al. ............ 29/852 |
| 2003/0219651 A1* | 11/2003 | Shinyama et al. ............ 429/223 |
| 2004/0191497 A1* | 9/2004 | Hiraoka et al. ............ 428/304.4 |
| 2006/0255476 A1* | 11/2006 | Kuhlman et al. ............ 257/782 |
| 2007/0177336 A1* | 8/2007 | Kuriyama .................... 361/528 |
| 2009/0114338 A1* | 5/2009 | Kawakita et al. ............ 156/249 |
| 2009/0277839 A1* | 11/2009 | Linford ........................ 210/656 |
| 2010/0193952 A1* | 8/2010 | Arana et al. .................. 257/746 |
| 2011/0222209 A1* | 9/2011 | Ohyama ....................... 361/523 |
| 2012/0008253 A1* | 1/2012 | Kuroda et al. ................ 361/502 |
| 2013/0001775 A1* | 1/2013 | Nishikubo et al. ........... 257/737 |
| 2013/0043067 A1* | 2/2013 | Hayashi ....................... 174/258 |
| 2013/0186675 A1* | 7/2013 | Takahashi et al. ............ 174/253 |
| 2013/0299219 A1* | 11/2013 | Chisaka et al. ............... 174/257 |
| 2013/0313687 A1* | 11/2013 | Bonkohara et al. .......... 257/621 |
| 2013/0341077 A1* | 12/2013 | Ouchi et al. ................. 174/264 |
| 2014/0332116 A1* | 11/2014 | Hwang ......................... 148/24 |

\* cited by examiner

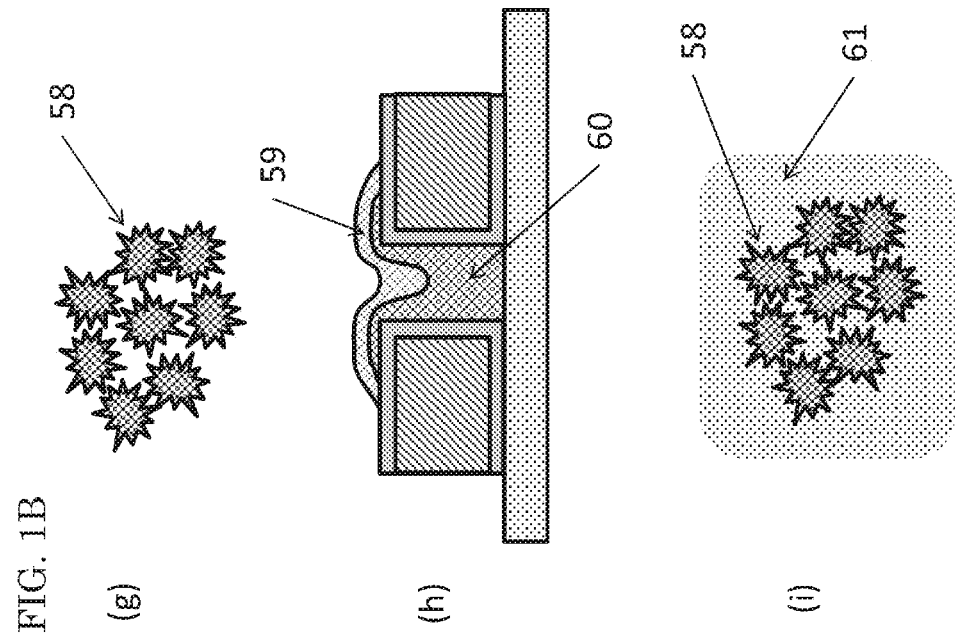
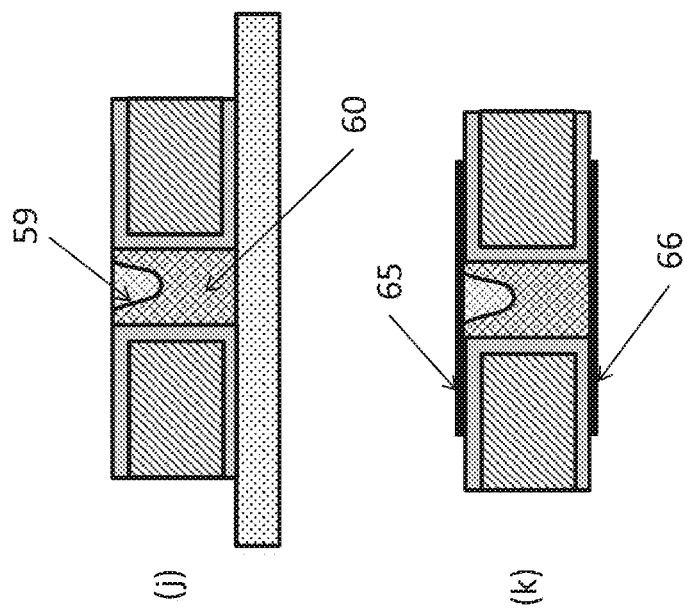
FIG. 1B

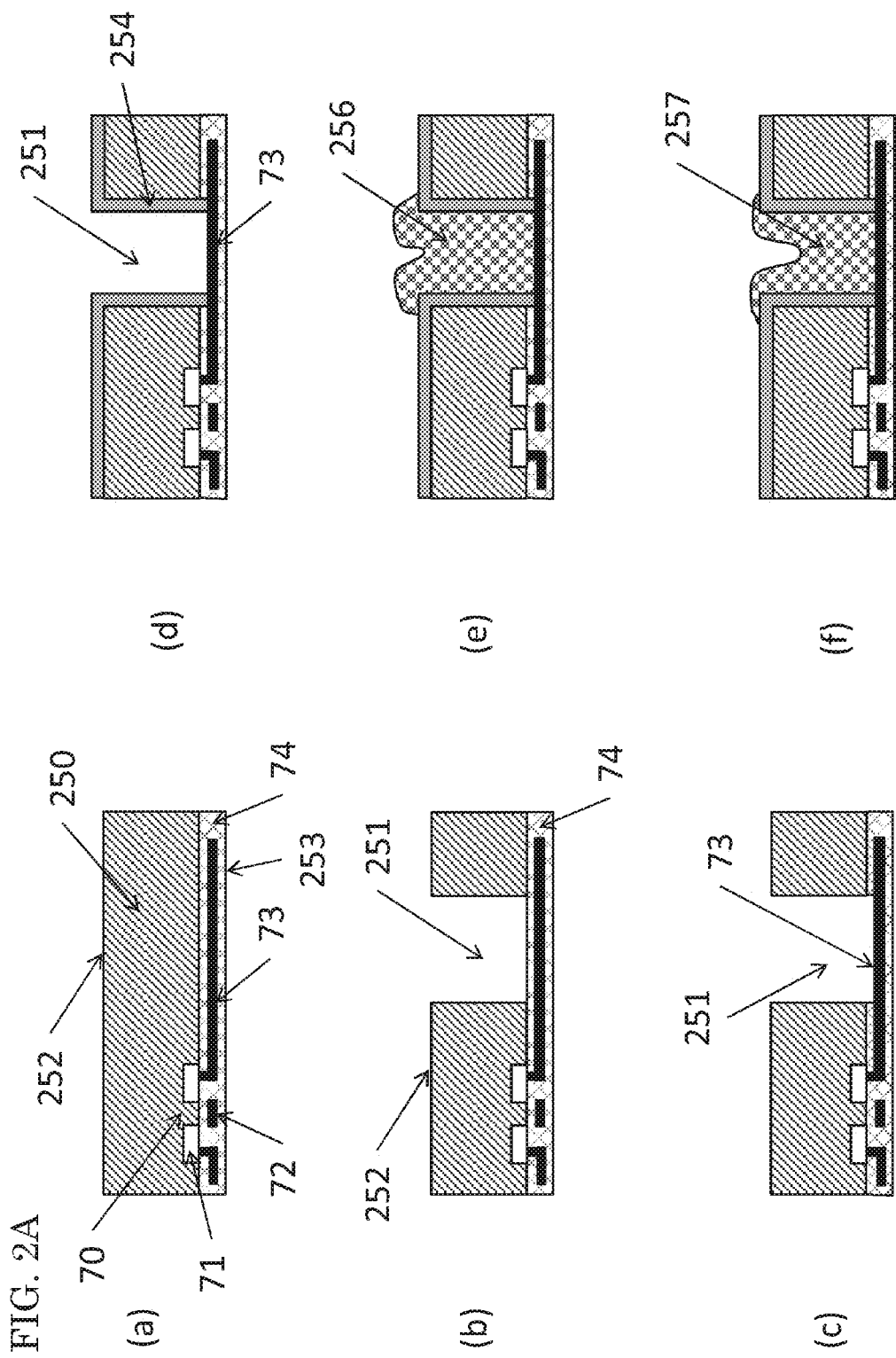

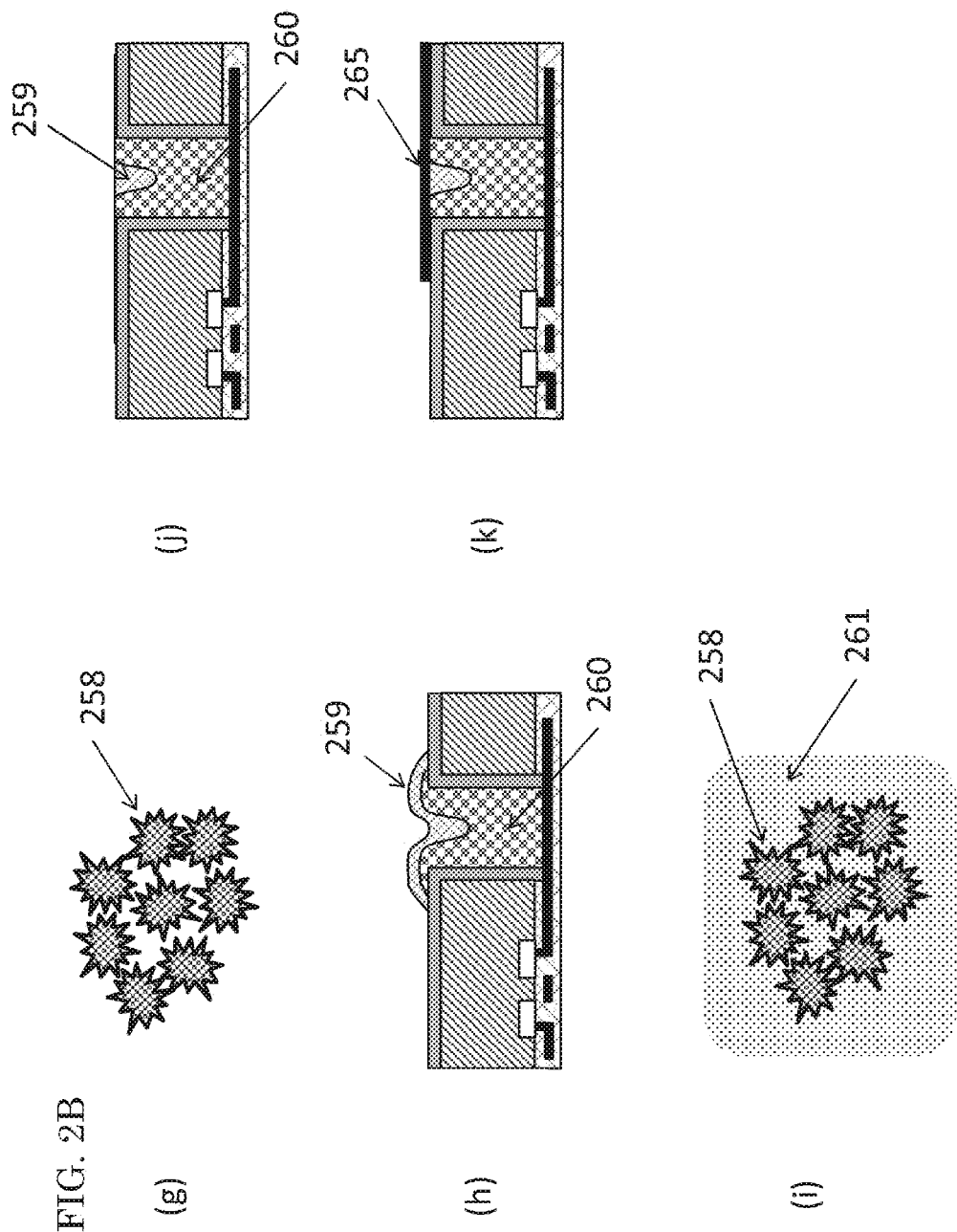

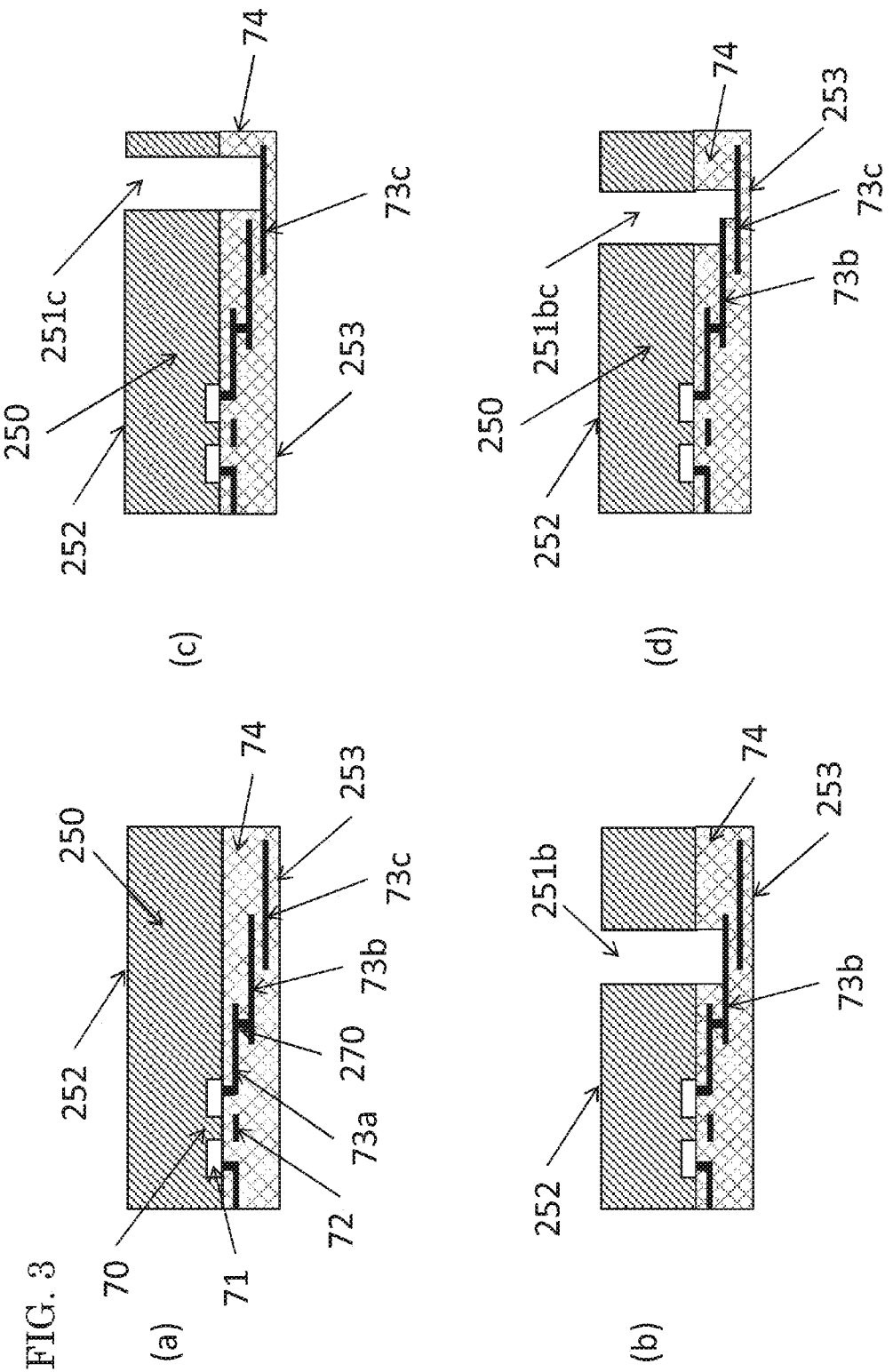

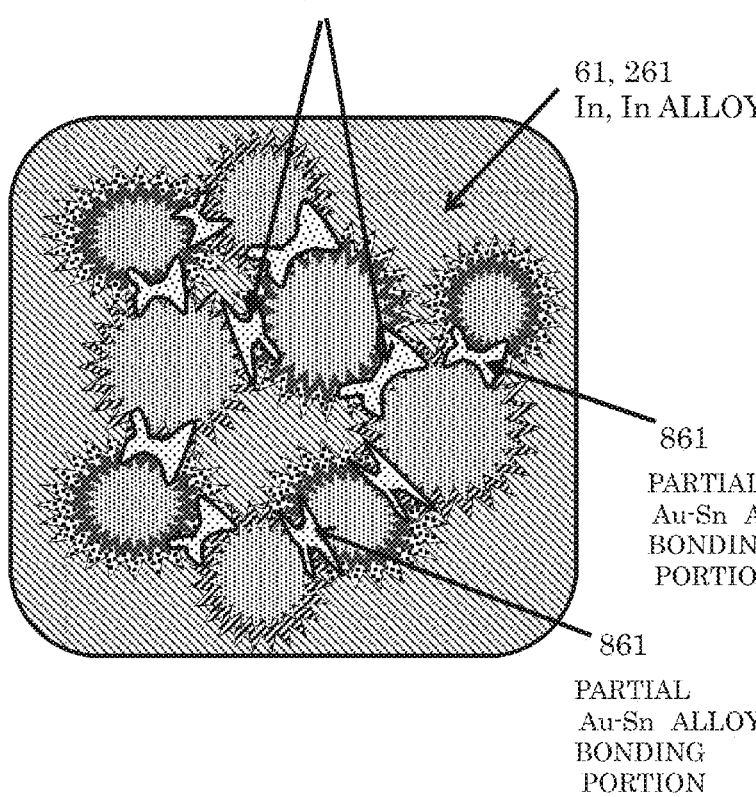

ELECTRODE, ELECTRODE MATERIAL, AND ELECTRODE FORMATION METHOD

This application is a Continuation-in-Part of United States Patent Application No. 13/740,688, filed Jan. 14, 2013, which claims priority from Japanese Patent Application No. 2012-005698, filed Jan. 13, 2012, the entire disclosure of which is incorporated herein by reference.

BACKGROUND OF THE INVENTION

1. Field of the Invention

The present invention relates to an electrode for penetration or embedding (hereinafter, which will be referred to a "through electrode" or "embedded electrode", respectively, and both of which will be referred to a "through/embedded electrode").

More particularly, the present invention relates to a through/embedded electrode to be formed in a hole or opening of a substrate (hereinafter, a structure including the substrate and the through/embedded electrode will be referred to an "electrode structure"), a material for the through/embedded electrode, and a method of forming the through/embedded electrode.

2. Description of the Related Art

As a method for forming a through electrode in an opening of a substrate which is essential for three-dimensional stacking of semiconductor chips, the following three conventional methods are generally known. However, all of them have problems for practical use because of the following difficulties:

The first method is the conformal copper plating as the representative example of liquid phase deposition. With this method, a dense thin film of copper is formed along the inner wall of an opening using an electroless plating solution. In this case, the thin film of copper covers the whole inner wall of the opening only, and the inside of the opening is not completely filled. This method has been already used in mass production; however, a recess is formed on one end face of a through electrode thus formed and therefore, a larger connection line pattern than the diameter of the through electrode is necessary in the alignment step of wiring. As a result, it is difficult to realize high-density wiring with the through electrode formed by this method.

The second method is the copper metal filling method. With this method, which is a typical example of vapor deposition, not only an expensive ionization sputtering apparatus or a metal CVD apparatus is required but also a processing time is long and fabrication cost is high. Moreover, since the whole through electrode is made of dense copper, the through electrode has a high modulus of elasticity. In addition, since the thermal expansion coefficient difference between the through electrode and a semiconductor substrate (e.g., silicon wafer) is large, an excessive internal stress occurs due to thermal shock induced by temperature cycling during the fabrication steps. For this reason, a crack may be formed in the semiconductor substrate.

The third method is the conductive metal paste filling method. With this method, a monomer is used as a diluent for a conductive metal paste and therefore, a lot of organic residues are left after drying and the conduction resistance of a through electrode is high. In the aftermath of this, not only restriction is applied to the circuit design but also the electrical characteristics are likely to be unstable.

Many improvements of the aforementioned three conventional methods have been disclosed, where the number of the proposed improvements for the aforementioned third method is relatively large.

For example, Patent Literature 1 (JP Patent Publication No. 2011-054907) discloses a method of depositing a suspension of metal powder in openings using a pressure and a filter. FIG. 4 corresponds to FIG. 1 of Patent Literature 1. In this figure, a substrate 101 having through holes 102 is disposed above a filter 140. The reference numeral 130 denotes a suspension of fine metal particles. By depressing a piston 120, the suspension 130 of fine metal particles is pushed into the through holes 102 and deposited. After taking the substrate 101 out and drying the same, a conductive paste is embedded into the through holes 102 and cured, resulting in through electrodes. With this method, the ratio of the metallic component of the through electrodes is raised by depositing metallic components twice, thereby contributing to the improvement of the conductivity of the through electrodes.

Patent Literature 2 (JP Patent Publication No. 2011-071153) discloses a method where a metal paste is coated on a wafer substrate with a blade while applying vibration to the metal paste, and at the same time, a suction pressure is applied to the wafer substrate from the opposite side thereof, thereby depositing the metal paste in the openings and sintering the metal paste thus deposited. FIG. 5 corresponds to FIG. 1 of Patent Literature 2. With this method, the packing density of the metal paste is raised to ensure the conductivity of the through electrodes.

Patent Literature 3 (JP Patent Publication No. 2009-277927) discloses a method where after coating a small amount of a metal paste, a molten metal is flowed through by applying heat and high-speed vibration in a vacuum atmosphere, thereby depositing the metal.

With the methods of Patent Literatures 1 to 3, the object of each of the methods is achieved; however, taking the damage applied to existing circuit patterns during the processing processes, attachment and detachment of an auxiliary material (supporting glass substrate, etc.), and all the implementation steps of a semiconductor device into considerations, these methods have a hindrance to practical use.

Regarding through electrodes, it is the biggest challenge in accomplishing performance sophistication and quality assurance of products to prevent reliability lowering due to cracks or the like which is induced by a thermal expansion coefficient difference between the materials used during alternating temperature cycle of fabrication processes, and to prevent signal transfer characteristic degradation due to the conductivity of a material or materials constituting the electrode.

Further, attention should be paid to the request for higher density arrangement also, which is induced along with miniaturization of the semiconductor manufacturing technology. To meet this request for higher density arrangement, reliability and signal transfer characteristic equivalent to those before size reduction are necessary even when reducing the size of a through electrode.

SUMMARY OF THE INVENTION

The present invention was created while taking the above-described circumstances into consideration, and an object of the present invention is to provide a low-resistance, high-reliability through/embedded electrode that can be arranged in a higher density according to the miniaturization of the semiconductor manufacturing technology, and a method of forming the through/embedded electrode.

Other objects of the present invention not specified herein will become apparent from the following description and the accompanying drawings.

In order to achieve the above objects and other objects not specified herein, with the present invention, attention is paid to the fact that the elastic modulus and strength of a porous material are inversely proportional to the porosity thereof, and the fact that an (impregnated) non-fully substitutional solid solution of a porous material exhibits approximately the same dynamic characteristics as those of the porous material, and further in addition, consideration to the fact that a current flowing through a through/embedded electrode is a high frequency current is taken.

A through/embedded electrode according to the present invention comprises:

a first porous conductor (porous sintered body) formed by sintering a first conductive material; and a second conductor embedded into gaps (vacancies) of the first conductor and cured;

wherein the second conductor comprises a second conductive material different from the first conductive material.

With the through/embedded electrode according to the present invention, since the aforementioned structure is provided, a low-resistance, high-reliability through/embedded electrode that can be arranged in a higher density according to the miniaturization of the semiconductor manufacturing technology is obtained.

In a preferred embodiment of the through/embedded electrode according to the present invention, the first conductor including the second conductor embedded into the gaps is a non-fully substitutional said solution.

A method of forming a through/embedded electrode according to the present invention, which is a method of forming a through/embedded electrode in an opening formed in a substrate, the method comprising the steps of:

forming a first porous conductor by sintering a paste-like first conductive material; and filling gaps of the first conductor with a second conductive material different from the first conductive material and curing the second conductive material, forming a second conductive material;

wherein the first conductor including the second conductor which has been embedded into the gaps constitutes a through/embedded electrode.

With the method of forming a through/embedded electrode according to the present invention, since the aforementioned steps are included, a low-resistance, high-reliability through/embedded electrode that can be arranged in a higher density according to the miniaturization of the semiconductor manufacturing technology can be formed.

In a preferred embodiment of the method of forming a through/embedded electrode according to the present invention, the first conductor including the second conductor embedded into the gaps is a non-fully substitutional solid solution.

It is preferred that a low-temperature sintering process is used in the step of sintering the first conductive material.

It is sufficient that the aforementioned "substrate" is a sheet or plate in or on which the through/embedded electrode is disposed. For example, the "substrate" may be a silicon wafer on which many devices have been already integrated, an non-patterned sheet or plate for intermediating the electrical connection of devices, or a patterned sheet or plate on which a wiring pattern is formed. The material of the "substrate" is optional; for example, a compound semiconductor of silicon, resin, ceramic, glass, or the like may be used.

Regarding the aforementioned "through/embedded electrode", there is a case (through electrode) where the electrode penetrates through the substrate to be exposed on both sides thereof as connection terminals for electrically interconnecting devices and/or wiring patterns formed on both sides of the substrate, as shown in FIG. 1B (k), and a case (embedded electrode) where the electrode is exposed on one side of the substrate as a connection terminal and is electrically connected to internal wiring lines on the other side of the substrate, as shown in FIGS. 3($b$), ($c$), and ($d$).

The aforementioned "opening" is an opening or hole extending from one main surface (for example, a first main surface) of the substrate toward the other main surface (for example, a second main surface) thereof, in which the electrode is formed. There are two types, i.e., non-penetrating and penetrating openings. The cross section of the opening is often circular; however it is not limited to this. Because of electrical connection, the inner wall of the opening needs to be insulative. If the material of the substrate is conductive (for example, silicon), the inner wall of the opening is conductive; thus, an insulating layer needs to be deposited on the inner wall of the opening.

The aforementioned "paste" is a viscous suspension generated by dispersing fine conductive particles as a solid constituent in a dispersing liquid (solvent). A paste that will leave no organic residues after vaporizing (evaporating) the dispersing liquid (solvent) used is preferred. A paste may include a reducing agent for keeping the activity on the surface of the conductive fine particles, such as COOH-system acids (e.g., formic acid and carboxylic acid), rosin wax (pine resin) and the like.

As the dispersing liquid (solvent), polyhydric alcohols such as ethylene glycol, butyl alcohol, and ester alcohol, or terpineol, pine oil, butyl carbitol acetate, butyl carbitol, carbitol, per-chloro ethylene is preferably used. These dispersing liquids (solvents) have advantages that the aggression toward a resist is low and that post-application drying can be easily performed because of they have volatility even at a comparatively low temperature (less than 50° C.) Among these dispersing liquids (solvents), polyhydric alcohols are particularly preferable because polyhydric alcohols are capable of drying at temperatures from room temperature to 100° C.

The aforementioned "first conductive material" comprises a fine particle made of a metal, an alloy, a metal compound, or a semiconductor; or a fine particle comprising a core made of an organic or inorganic material and a conductive film (skin) covering the core; or both of them. The particle size is generally observed as 0.3 μm to 10 μm. For example, even if the actual particle size of the particle is 0.1 μm or less, these particles are agglomerated by electrostatic force or the like and therefore, they are usually observed to have a particle size of 0.3 μm to 10 μm.

As the material for the first conductive material, the following are preferably used. However, the present invention is not limited them.

Regarding metals, tungsten, molybdenum, chromium, indium, tin, gold, silver, etc. may be preferably used.

Regarding metal compounds, a metal compound including one of the aforementioned metals (e.g., tungsten) as the constituent may be preferably used. Since the percentage(s) of the constituent material is/are various, the metal compound may be termed a "mixture" rather than a "compound".

Regarding semiconductors, silicon, germanium, a compound semiconductor, silicon carbide, carbon, or the like may be preferably used.

Regarding the fine particle comprising the core made of an organic material and the conductive film (skin) covering the core, a fine conductive particle comprising a metal film (skin) made of indium, gold, silver, platinum, tin, or the like formed by plating to cover a core made of a resin material are preferably used.

Regarding the fine particle comprising the core made of an inorganic material and the conductive film (skin) covering the core, a fine conductive particle comprising a thin film (skin) made of any conductive film formed by plating to cover a core made of a metal, a semiconductor such as silicon and germanium, silicon carbide, a carbon-based material, a diamond-like material, silicon nitride, aluminum nitride, borosilicate glass, boron nitride ceramics, or the like is preferably used.

As the material for the conductive film (skin), indium, an indium alloy, nickel-gold, gold, silver, copper, platinum, tin, zinc, bismuth, gallium, cadmium, titanium, and tantalum are preferably used.

In the case where the first conductive material includes a fine conductive particle having a conductive film (skin) formed to cover a core made of an inorganic material, it is preferred that this conductive particle includes a core made of tungsten and a conductive film (skin) made of at least one of indium, tin, copper, and precious metals (gold, silver, platinum, etc.).

In the case of a fine conductive particle generated by covering a core with a conductive film (skin), in order to increase the peel strength between the core and the film (skin), an intermediate film made of one of copper, nickel, titanium, and tantalum (all of which have a barrier property), or a combination of at least two of them may be formed on the surface of the core, where the film (skin) is formed to cover the intermediate film. Moreover, by this intermediate film, there arises an advantage that the electrical characteristics of the particle can be improved, for example, the electric resistance of the core can be reduced.

As the criteria for selecting the first conductive material, the following three points are conceivable.

(1) In order to ensure good reliability, it is recommended that the thermal expansion coefficient difference between the first conductive material and the substrate is small, and that the thermal expansion coefficients of the substrate and the porous sintered body is no more than 3 times it is recommended that in ratio. This restriction is required for preventing an internal stress generated by the thermal expansion coefficient difference between the first conductive material and the substrate from breaking the substrate when the substrate including the first conductive material is exposed to a high temperature atmosphere.
(2) In order to ensure good signal transmission characteristics, it is preferred that the electrical resistance of the first conductive material is low.
(3) It is preferred that the sintering (diffusion bonding) temperature of the first conductive material is 300° C. or low. Taking the fact that most of the substrates in which the through/embedded electrodes are formed are silicon wafers on which a large number of devices are integrated into consideration, the sintering (diffusion bonding) temperature needs to be limited to a temperature lower than the highest temperature during the fabrication processes of the integrated circuit in order not to damage the peripheral circuits of the integrated circuit.

The aforementioned "second conductive material" comprises particles including at least one of metal, alloy, and semiconductor particles having a low melting point. The properties of the second conductive material need to be different from those of the first conductive material. It is preferred that the particle size of the second conductive material is smaller than that of the first conductive material. It is preferred that the melting point of the second conductive material has a value not exceeding the sintering temperature of the first conductive material or the temperature at which the sintered alloy portion (the sintered body) melts.

Preferred examples of the second conductive material are an alloy of low melting-point metal, such as indium-based alloy, tin-based alloy (tin silver, gold tin, etc.), bismuth-based alloy (tin, bismuth, etc.), gallium-based alloy, zinc-based alloy, and solder; and a low melting-point metal with an alloy rate of 0%, such as indium, tin, gallium, and bismuth. Table 1 shows typical examples of the combination; however, the present invention is not limited these examples.

TABLE 1

| Melting Temperature (° C.) | Sn | Bi | In |
| --- | --- | --- | --- |
| 78.8 | 17.3% | 57.5% | 25.2% |
| 117.0 | 48.0% | — | 52.0% |
| 138.0 | 42.0% | 58.0% | — |
| 213.9 | 100.0% | — | — |
| 271.5 | — | 100.0% | — |
| 156.6 | — | — | 100.0% |

As a method for applying the aforementioned paste, known methods can be used; thus, the explanation about it is omitted here. However, it is necessary to pay attention to the filing rate increase of the paste and to the prevention of generating voids Usually, it is sufficient for the present invention that the aforementioned "low-temperature sintering process" is a low-temperature heat treatment that is carried out at a temperature not exceeding 300° C. Due to heating, the liquid ingredient of the paste is vaporized and then, diffusion bonding occurs in the vicinities of the contacting portions of the activated fine particles as the solid ingredient of the paste in a reducing atmosphere using a hydrogen/nitrogen forming gas or the like, or with a reducing agent contained in the paste, e.g., a "COOH-system acid" such as formic acid and carboxylic acid or a rosin wax (pine resin). As a result, the first porous conductor is formed or sintered.

In this case, the temperature of the diffusion bonding is much lower than the melting point of the particles (or the conductive film (skin) of the particles) as the solid ingredient of the paste.

If the particles (or the conductive film (skin) of the particles) as the solid ingredient of the paste are formed by suitably combining different metals, the melting temperature of the alloy formed by the diffusion bonding can be made much higher than the sintering temperature. This is an extremely advantageous behavior in the subsequent processes.

The size and occupation ratio of the gaps or vacancies in the porous sintered body is dependent upon the size and contour of the fine particles as the solid ingredient. By impregnating and solidifying the second conductive material into the gaps or vacancies, the through or embedded electrode is obtained.

As a method for the aforementioned "impregnation", the paste containing the second conductive material may be applied to the porous first conductor to impregnate the first conductor with the second conductive material, and then, the second conductive material may be malted by heat treatment. By this method, the second material is deposited in the gaps or vacancies of the first conductor and re-solidified and as a result, the aforementioned "second conductor" is obtained.

If the melting point of the second conductive material is low, the following method may be used: Specifically, the second conductive material is melted by an application machine, and the second conductive material thus melted is applied to the porous first conductor placed on the preheated substrate to thereby impregnate the first conductor with the second conductive material in a vacuum, reducing, or inert gas atmosphere; thereafter, the first conductor impregnated with the second conductive material is cooled. By this way also, the second conductor can be obtained.

With the through/embedded electrode according to the present invention, it is preferred that the ingredient volume percentage of the first conductor is larger than that of the second conductor. This is to keep the dynamic property of the first conductor for the dynamic property of the through/embedded electrode.

In the method of forming the through/embedded electrode according to the present invention, electrical connection of the through/embedded electrode to the devices and the wiring patterns formed on the substrate varies according to the substrate material and the arrangement complexity of the devices and the wiring patterns. However, this is well known. Therefore, the explanation for the electrical connection is omitted here.

The basic process of forming the through/embedded electrode according to the present invention excluding the complex peripheral factors comprises the following steps (1) to (7) in general.

(1) Forming an opening from one surface (the first major surface) of a substrate
(2) Forming an insulating layer on the inner wall of the opening
(3) Applying a paste containing a first conductive material as its solid ingredient to the opening, depositing the paste in the opening to fill the opening with the paste
(4) Low-temperature sintering to form a first porous conductor
(5) Applying a paste containing a second conductive material as its solid ingredient (or a molten second conductive material) to the first porous conductor to deposit the same paste on the first conductor
(6) Melting and impregnating the second conductive material
(7) Making the first or second major surface of the substrate or both of the first and second major surfaces thereof flat Among these seven steps, the above step (2) is unnecessary if the substrate is made of an insulative material, such as resin, ceramic or glass.

It may be necessary that the above step (3) is performed repeatedly in order to obtain a required deposition amount of the solid ingredient. Further, in order to promote the deposition of the solid ingredient, the above step (3) may be carried out while preheating the substrate.

In the above step (4), the processing temperature is set according to the ingredient configuration of the first conductive material. The above step (4) may be carried out in a reducing atmosphere such as an atmosphere using a hydrogen/nitrogen forming gas or the like, or in an inert gas atmosphere using nitrogen or argon gas, if necessary.

Similar to the above step (3), the above step (5) may be performed repeatedly. If the material to be applied is a molten metal, it is deemed necessary to use a vacuum atmosphere, or a mix atmosphere indicating a weak reducing property.

In the above step (6), generally, a vacuum atmosphere is required. However, there is a possibility that a vacuum atmosphere is unnecessary if the material to be applied is a molten metal.

The above step (7) is prepared for making the uneven surface(s) of the substrate flat for the subsequent process steps. This is because uneven spots are usually formed on the major surface(s) of the substrate by the exposed end(s) of the through/embedded electrode during the formation step of the opening.

Finally, the basic concept of the through/embedded electrode and the formation method thereof according to the present invention will be explained below.

Based on the result of the inventors' examination for thermal shock applied to the through/embedded electrode during an alternating temperature cycle, it is considered that this thermal shock is induced by pressure fluctuation applied to the inner wall of the opening of the substrate due to the volume change of the through/embedded electrode. In theory, as long as the through/embedded electrode is made of a material whose thermal expansion coefficient is similar to that of the substrate, no stress will occur.

In usual environments where the through/embedded electrode is used, the current passing through the through/embedded electrode is a high-frequency current and therefore, "skin effect" cannot be ignored to lower the conduction resistance of the through/embedded electrode.

Therefore, for example, a fine particle having a thermal expansion coefficient closer to that of the substrate is prepared as a core, and a low-resistance conductive film (skin) is formed on the surface of the core, thereby generating a fine conductive particle (a first conductive material). Thereafter, the fine conductive particles as the first conductive material are deposited and sintered, resulting in a porous conductor (a porous sintering body) having continuous gaps or vacancies, which serves as a first conductor. During this sintering process, the contacting portions of the conductive films (skins) of the fine conductive particles are interconnected and thus, three-dimensional mesh-like conductive paths are formed. In this porous conductor (porous sintered body), since the interconnecting line between the surfaces of the contacting portions is longer than the peripheral line of a pillar of the same caliber in any cross-section, a wider surface area for conduction is obtained.

Moreover, in order to connect the broken points of the aforementioned interconnecting line, the gaps or vacancies of the porous conductor (porous sintering body) are impregnated with a melt of the second conductive material and thereafter, this melt is re-solidified. Thus, more preferred conduction paths can be ensured.

As a result, a through/embedded electrode which has a thermal expansion coefficient closer to that of the substrate and which has a high-frequency conductivity closer to that of a metal body of the same diameter is obtained.

In the case where the core is made of a metal or alloy, the through/embedded electrode can be regarded as a metal body having an uneven distribution of ingredients. Therefore, even if the current passing through the through/embedded electrode is a low frequency or direct current (DC), high conductivity can be ensured.

In the formation method of the through/embedded electrode according to the present invention, expensive facilities are unnecessary and thus, there is an advantage that the fabrication cost can be effectively suppressed.

As explained above, the present invention has the following advantageous effects:

Specifically, a low-resistance, high-reliability through/embedded electrode that can be arranged in a higher density according to the miniaturization of the semiconductor manufacturing technology can be obtained and at the same time, this electrode formed at a low cost.

BRIEF DESCRIPTION OF THE DRAWINGS

In order that the present invention may be readily carried into effect, it will now be described with reference to the accompanying drawings.

FIG. 1B is a schematic drawing showing the steps of forming the through electrode according to the first embodiment of the present invention, which is subsequent to the steps of FIG. 1A.

FIG. 2A is a schematic drawing showing the steps of forming an embedded electrode according to a second embodiment of the present invention.

FIG. 2B is a schematic drawing showing the steps of forming the embedded electrode according to the second embodiment of the present invention, which is subsequent to the steps of FIG. 2A.

FIG. 3 is a schematic drawing showing the steps of forming an embedded electrode according to a third embodiment of the present invention.

FIG. 6H is an explanatory drawing showing the internal structure of the through/embedded electrode to be formed by the method of forming a through/embedded electrode according to the fourth embodiment of the present invention, in which the bonding state of the metal particles shown in FIG. 6D is schematically shown.

DETAILED DESCRIPTION OF THE PREFERRED EMBODIMENTS

Figure 1A:
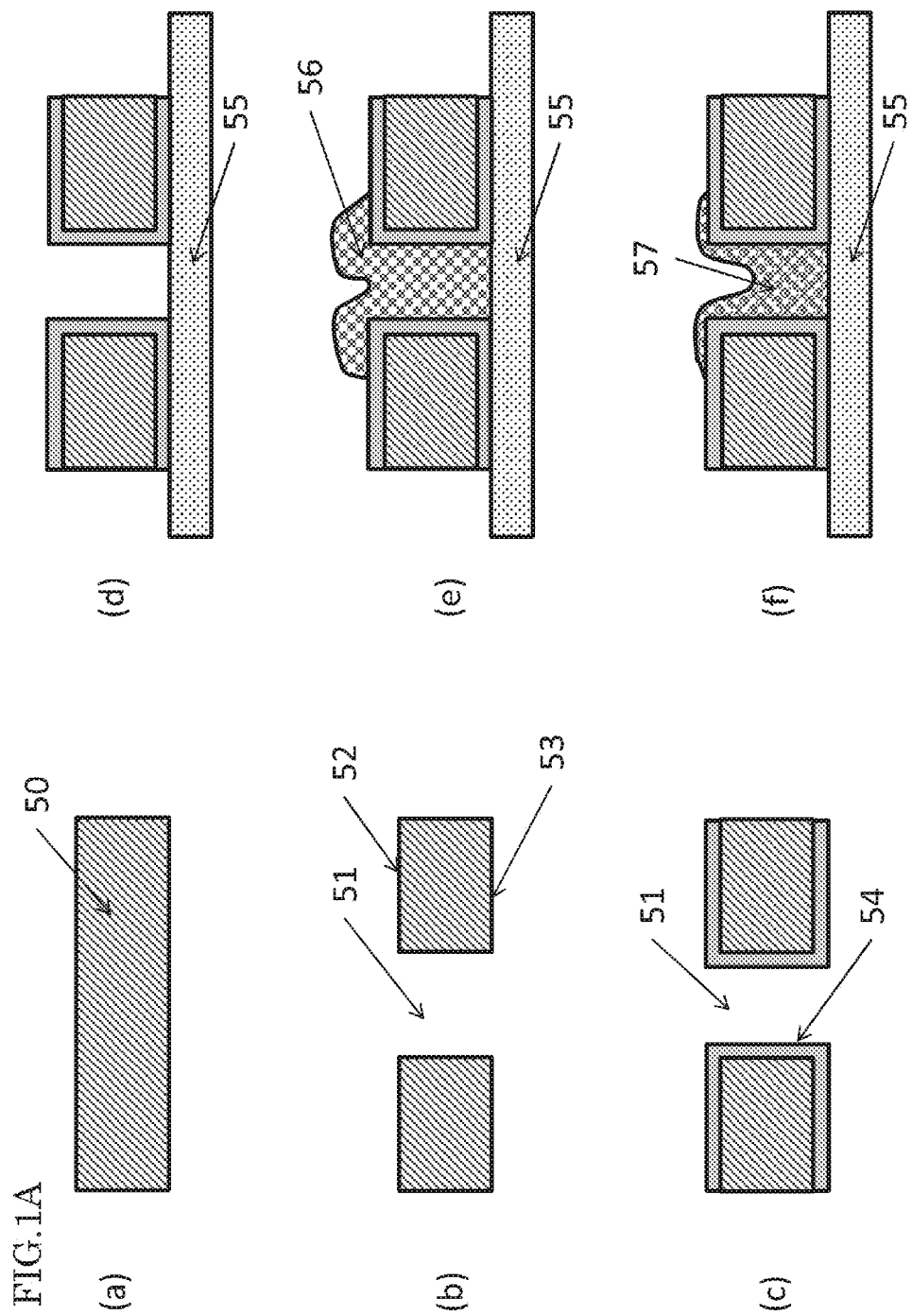
FIG. 1A is a schematic drawing showing the steps of forming a through electrode according to a first embodiment of the present invention.
Figure 4:
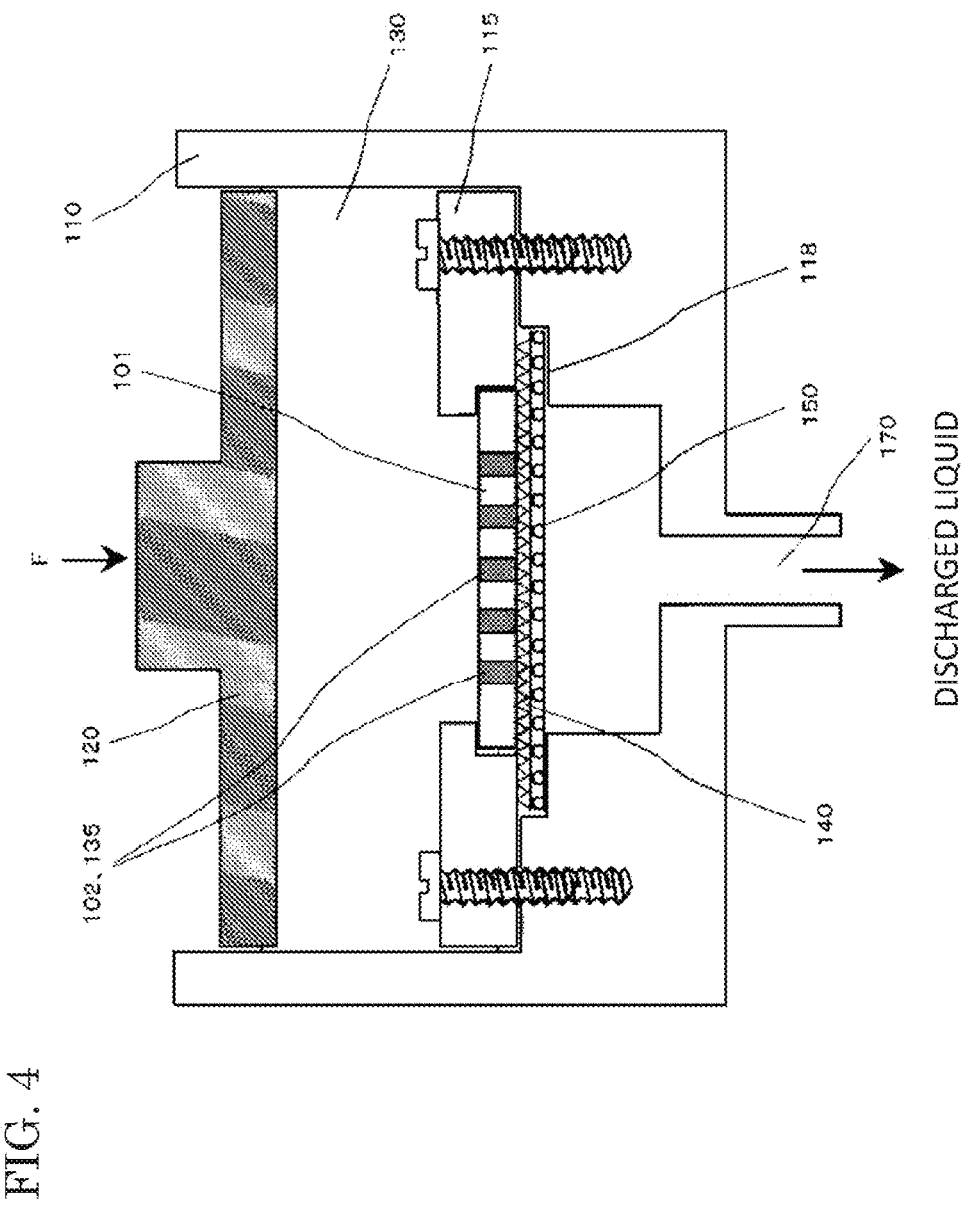
FIG. 4 is a schematic drawing showing an example of the conventional methods of forming a through electrode.
Figure 5:
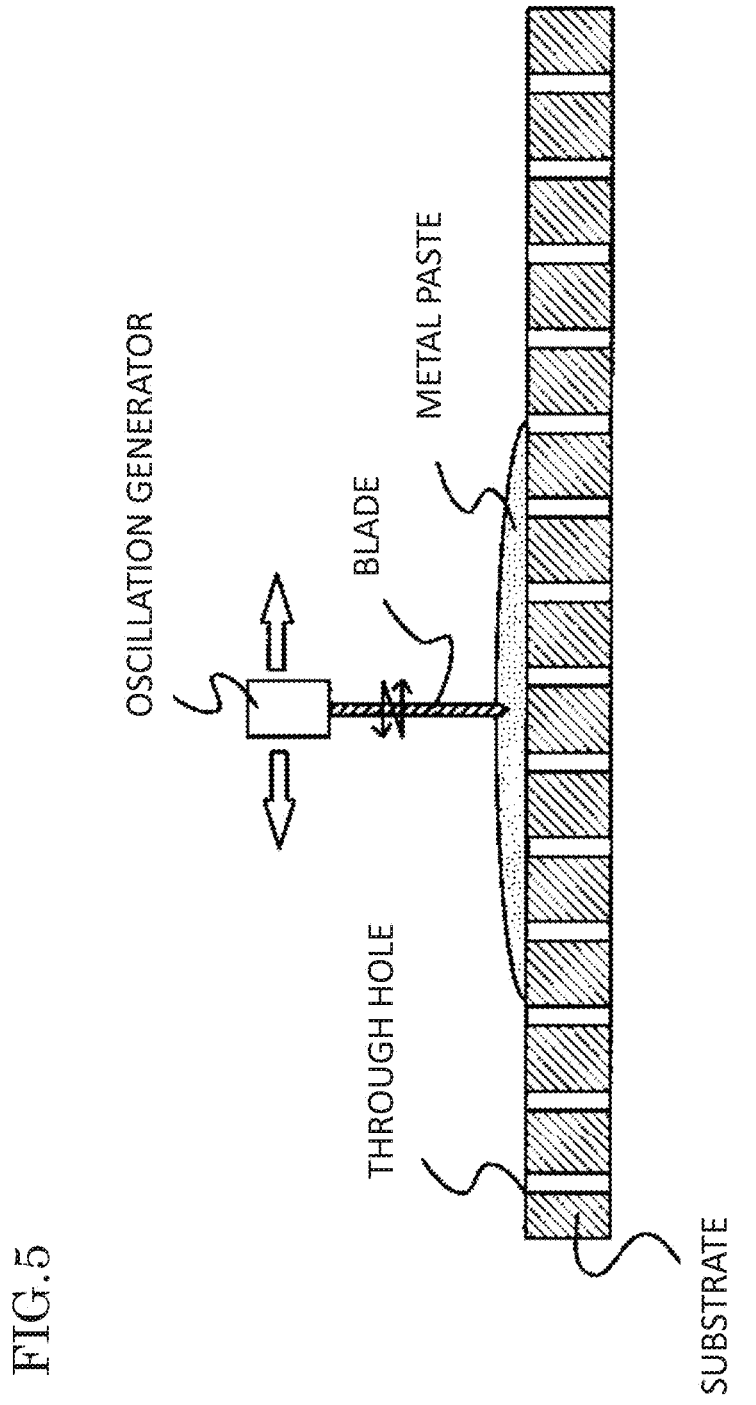
FIG. 5 is a schematic drawing showing another example of the conventional methods of forming a through electrode.

Preferred embodiments of the present invention will be described in detail below while referring to the drawings attached. However, the present invention can be carried out in many different forms. Therefore, it is easily understood for an ordinary skill in the art that the form, structure and/or material are changeable without departing the spirit and scope of the present invention.

Accordingly, the present invention is not construed to be limited to these exemplary embodiments. In the following description, the same reference numerals are attached to the same or equivalent pats or elements and the explanation about these parts or elements will be omitted.

First Embodiment

FIGS. 1A and 1B show a method of forming a through electrode according to a first embodiment of the present invention. This embodiment is a case where both ends of an electrode are exposed at both major surfaces of a substrate as connection terminals, wherein the electrode is in the form of a through electrode. This substrate in which the through electrode is formed serves as an interposer.

First, as shown in FIG. 1A(a), a substrate 50 is prepared.

Next, as shown in FIG. 1A(b), an opening or hole 51 is formed in the substrate 51. The opening 51 penetrates through the substrate 50 from the first major surface 52 (upper surface in this drawing) to the second major surface 53 (lower surface in this drawing) thereof. The inner diameter of the opening 51 is in the range from several micrometers to 100 μm.

Next, as shown in FIG. 1A(c), an insulating layer 54 is formed on the inner wall of the opening 51. Dependent upon the formation method, the insulating layer 54 is formed not only on inner wall of the opening 51 but also on the first and second major surfaces 52 and 53. However, if the material of the substrate 50 is insulative, the insulating layer 54 is not necessary.

The material of the substrate 50 may be chosen from various materials. However, a semiconductor substrate made of silicon, germanium, or the like, a compound semiconductor substrate, or a ceramic or glass substrate having a thermal expansion coefficient at the same level as a semiconductor substrate for mounting semiconductor devices is preferably used.

Next, as shown in FIG. 1A(d), a supporting plate 55 made of a glass or the like is attached onto the second major surface 53 of the substrate 50. In the case where the insulating layer 54 is extended to the second major surface 53, the supporting plate 55 is fixed to the second major surface 53 by way of the insulating layer 54. The supporting plate 55 has a role to close the bottom of the opening 51.

Next, as shown in FIG. 1A(e), a paste 56 containing a first conductive material is deposited to fill the opening 51 with the paste 56 from the mouth of the opening 51 on the side of the first major surface 52. At this time, part of the paste 56 is protruded from the opening 51.

As an example of the paste 56 containing the first conductive material is a 85 w % viscous suspension generated by using a tungsten particle (which is a core and which has an external diameter or particle size of 0.3 μm to 0.5 μm) whose surface is covered with a tin thin film (skin) having a thickness of approximately one tenth (1/10) to approximately two hundredth (1/200) of the particle size of the core (in this example, 0.0015 μm to 0.05 μm in thickness), and another tungsten particle (which is a core and which has an external diameter or particle size of 0.3 μm to 0.5 μm) whose surface is covered with a silver thin film (skin) having a thickness of approximately one tenth (1/10) to approximately two hundredth (1/200) of the particle size of the core (in this example, 0.0015 μm to 0.05 μm in thickness), wherein the aforementioned two tungsten particles are mixed together in a one-to-one relationship (1:1) along with a dispersion liquid and a volatile solvent. Since this viscous suspension contains a fine conductive particle made of the tungsten core and the tin film (skin) and another fine conductive particle made of the tungsten core and the silver film (skin), this suspension contains two types of fine conductive particles that the cores are made of the same metal and the thin films (skins) are made of different metals. Needless to say, the substance, content, solvent, and the like of the paste 56 are not limited to those shown by this example.

The thicknesses of these thin films (here, the tin and silver films formed by plating, substitution, or the like) need to be equal to or less than the thickness at which the melted parts of the thin films having different volume ratios to the core (here, tungsten particles) do not fill all the gaps or vacancies formed by the core. This is because the gaps need to be embedded by another molten metal in a subsequent step and therefore, the gaps need to be consecutive as a whole even if the gaps are partially filled. Another reason is that if voids are generated due to insufficient filling of the gaps by the molten metal, the resistance component increases and the conductivity of the through electrode lowers.

In addition, when the level of conductivity lowering of the through electrode due to insufficient filling of the gaps is sufficiently low, there is a possibility that no problem occurs for the purpose of the through electrode. In this case, the above-described condition for the thickness of the thin film (skin) is unnecessary. Moreover, if the conductivity of the through electrode can be adjusted to be a desired level or higher without the gap filling process, the process itself of filling the gaps using a paste 59 which will be described later can be omitted.

For the filling process of the paste 56, a well-known method such as micro pipette and screen printing may be used. By adjusting the grain size and solid ingredient ratio (diluent ratio) of the fine conductive particles of the paste 56 while taking the performance of the application or coating machine, coating speed, and deposition density, etc., into consideration, the paste 56 can be easily filled. As the coating machine, it is preferred to use a relatively inexpensive jet dispenser. Depending on the performance of the selected machine, the repetition number of the coating process varies. If the machine has the general specification, the coating process needs to be repeated twice.

Next, as shown in FIG. 1A(f), a first porous conductor 57 is formed in the opening 51 with the paste 56 by a low-temperature sintering process in a reducing atmosphere. The liquid volatile ingredients contained in the paste 56 are dissipated and the conductive particles contained in the paste 56 as the solid ingredient is contracted and deposited. As a result, these conductive particles are brought into partial contact. Thereafter, diffusion bonding occurs among the metal films (here, tin and silver films) existing on the surfaces of the activated fine conductive particles. In this way, the conductive particles are sintered to form the first porous conductor 57. The degree of the contraction and deposition of the conductive particles vary depending on the content of the solid ingredient of the paste 56.

In the aforementioned example of the paste 56, since the cores of the two types of the conductive particles are made of tungsten and the thin films (skins) of these particles are made of tin and silver, respectively, the main constitutional element of the first conductor 57 as the sintering body is tungsten particles, where the tin and silver films disposed around the tungsten particles are bonded together to thereby form conductive paths.

In this embodiment, the conditions for the low-temperature sintering process are that this process is carried out in a $N_2$ atmosphere containing a reducing agent $H_2$ of 2%, and the process temperature is 230° C. Needless to say, the invention is not limited to this condition.

FIG. 1B(g) is an explanatory drawing showing the partial contacting state of the fine conductive particles 58 of the porous first conductor 57. Due to the partial contact of the particles 58, consecutive gaps or vacancies are formed among the particles 58.

Next, as shown in FIG. 1B(h), a paste 59 containing a second conductive material is applied to cover the first porous conductor 57. Then, the paste 59 is temporarily melted by a low-temperature heat treatment and thereafter, deposited and re-solidified. In this way, a non-fully substitutional solid solution 60 forming the through electrode is formed in the opening 51. At this time, a molten material 61 (a second conductive material) as a part of the paste 59 as the second conductor penetrates into the gaps (see FIG. 1B(g)) of the first porous conductor 57 and finally, the gaps are filled with the material 61 (see FIG. 1B(i)). The non-fully substitutional solid solution 60 thus formed constitutes the through electrode according to the first embodiment.

An example of the paste 59, a paste of an indium-based alloy (e.g., indium: 52%, tin: 48%, melting point: 120° C.), where the particle diameter of the indium-based alloy particle (conductive fine particles) contained is from 0.03 μm to 0.05 μm and the solid ingredient is 80 wt % to 99 wt %, is preferably used. This is because this mixing ratio prevents aggregation of the indium-based alloy particles and makes it possible to supply filler(s) sufficiently.

The solidifying process of the molten material 61 (second conductive material, indium-based alloy) of the paste that has penetrated into the gaps of the porous first conductor 57 to the non-fully substitutional solid solution 60 is shown in FIG. 1B(i). During this solidifying process, the molten material 61 is bonded to the conductive particles 58 constituting the first conductor 57 in their contact surfaces due to diffusion bonding, where metal-to-metal wetting occurs.

Next, as shown in FIG. 1B(j), the projections formed in the formation step of the non-fully substitutional solid solution 60 that forms the through electrode are removed to planarize the side of the first major surface 52 of the substrate 50. This planarization step may be carried out by a well-known manner such as the mechanical polishing and CMP (planarization process in combination with the mechanical polishing and chemical reactions).

Finally, as shown in FIG. 1B(k), the supporting substrate 55 is detached from the second main surface 53 of the substrate 50 and thereafter, an electric wiring layer 66 is formed on the side of the second main surface 53 in such a way as to be contact with one end of the non-fully substitutional solid solution 60 that forms the through electrode. Then, an electric wiring layer 65 is formed on the side of the first main surface 52 in such a way as to be contact with the other end of the solid solution 60.

Through the aforementioned process steps, a structure (through electrode structure) including the through electrode constituted by the non-fully substitutional solid solution 60 is formed in the opening 51 of the substrate 50, and the electric wiring layers 65 and 66 electrically connected to this through electrode are formed.

As described above, with the method of forming a through/embedded electrode according to the first embodiment, compared with the conventional formation methods of a through/embedded electrode, a highly conductive through electrode can be formed in a comparatively short time without reliability lowering of the entire substrate, degradation of signal transmission characteristics, and requirement of expensive facilities.

Moreover, since high temperature treatment processes exceeding 230° C. can be avoided in the process steps of forming the through electrode, a through electrode can be formed on a substrate wafer made of semiconductor, glass, ceramic or the like on which semiconductors devices and/or organic devices have been formed and which cannot be subjected to high-temperature processes. Thus, this method is much effective for such the purpose, In this way, the method according to the first embodiment does not include a high temperature thermal treatment process whose temperature is 300° C. or higher and therefore, there is no possibility of the characteristics fluctuation and/or degradation of the devices that have been formed on a silicon wafer. Furthermore, since the conductivity of the through electrode is large, the size of the through electrode through which a large current or a high-speed signal is difficult to pass can be reduced, which means that higher integration can be realized at a low fabrication cost and three-dimensional stacking can be accomplished.

In addition, in the case where the conductivity of the through electrode can be adjusted to be a desired level or higher and thus, the process step of filling the gaps of the first conductor 57 using the paste 59, the through electrode is made of the first conductor (porous sintered body) 57 only. This is applicable to the second to fourth embodiments which will be explained later.

Second Embodiment

FIGS. 2A and 2B show a method of forming an embedded electrode according to a second embodiment of the present invention. This embodiment is a case where one end of an electrode is exposed at one major surface of a substrate as a connection terminal, and the other end of the electrode is connected to a wiring line or layer of a semiconductor device that has been formed on the substrate from the inside of the substrate, wherein the electrode is in the form of an embedded electrode.

First, as shown in FIG. 2A(a), a transistor 70 is formed on the side of a second major surface 253 (lower surface in this drawing) of a substrate 250 such as a semiconductor wafer by a known method. The transistor 70 comprises a gate electrode 72, and a pair of the diffusion layers 71 disposed at each side of the gate electrode 72. Wiring layers 73 are respectively connected to the pair of diffusion layers 71. The gate electrode 72 and the wiring layers 73 are disposed in an insulating layer 74 (which is usually an oxide film).

Next, as shown in FIG. 2A(b), an opening 251 is formed in the substrate 250 by a well-known pattern-formation and subsequent etching processes. Concretely speaking, the substrate 250 is selectively removed from the side of the first major surface 252 (upper surface in this drawing) to the insulating layer 74 on the side of the second major surface 253. The opening 251 penetrates through the substrate 250.

Next, as shown in FIG. 2A(c), the insulating layer 74 is selectively etched on the side of the first major surface 252 through the opening 251 by a reactive ion etching or the like in a hydrofluoric acid (HF) gas atmosphere, thereby exposing the wiring layer 73 which is located right below the opening 251.

Next, as shown in FIG. 2A(d), an insulating layer 254 is formed on the inner wall of the opening 251 and the first major surface 252. Since the insulating layer 254 is formed on the exposed surface (at the bottom of the opening 251) of the wiring layer 73 at this time, this part of the insulating layer 254 is removed by a well-known method. Dependent upon the formation method, the insulating layer 254 is formed not only on inner wall of the opening 251 but also on the first major surface 252.

Through the above process steps, an "opening on the bottom of which a conductor is formed" is formed. Because the subsequent process steps are the same as those of the first embodiment, they will be explained below in a simple manner.

Specifically, subsequent to the step of forming the insulating layer 254, as shown in FIG. 2A(e), a paste 256 containing a first conductive material is deposited to fill the opening 251 with the paste 256 from the mouth of the opening 251 on the side of the first major surface 252 in the same way as the aforementioned first embodiment. At this time, part of the paste 256 is protruded from the opening 251.

Next, as shown in FIG. 2A(f), a first porous conductor 257 is formed in the opening 251 with the paste 256 in the same way as the above first embodiment. By a low-temperature sintering process in a reducing atmosphere, the liquid volatile ingredients contained in the paste 256 are dissipated and the conductive particles contained in the paste 256 as the solid ingredient is contracted and deposited. As a result, these conductive particles are brought into partial contact. Thereafter, diffusion bonding occurs among the metal films existing on the surfaces of the activated fine conductive particles. In this way, the conductive particles are sintered to form the first porous conductor 257. The degree of the contraction and deposition of the conductive particles vary depending on the content of the solid ingredient of the paste 256.

FIG. 2B(g) is an explanatory drawing showing the partial contacting state of the fine conductive particles 258 of the porous first conductor 257. Due to the partial contact of the particles 258, consecutive gaps or vacancies are formed among the particles 258.

Next, as shown in FIG. 2B(h), in the same way as the above first embodiment, a paste 259 containing a second conductive material is applied to cover the first porous conductor 257. Then, the paste 259 is temporarily melted by a low-temperature heat treatment and thereafter, deposited and re-solidified. In this way, a non-fully substitutional solid solution 260 forming the embedded electrode is formed in the opening 251. At this time, a molten material 261 (a second conductive material) as a part of the paste 259 as the second conductor penetrates into the gaps (see FIG. 2B(g)) of the first porous conductor 257 and finally, the gaps are filled with the material 261. The non-fully substitutional solid solution 260 thus formed constitutes the through electrode according to the second embodiment.

The molten material 261 of the paste 259 that has penetrated into the gaps of the porous first conductor 257 is bonded to the conductive particles 258 constituting the first conductor 257 in their contact surfaces due to diffusion bonding, where metal-to-metal wetting occurs. This solidifying process is shown in FIG. 2B(i).

Next, as shown in FIG. 2B(j), in the same way as the above first embodiment, the projection formed in the formation step of the non-fully substitutional solid solution 260 that forms the embedded electrode is removed to planarize the side of the first major surface 252 of the substrate 250.

Finally, as shown in FIG. 2B(k), an electric wiring layer 265 is formed on the side of the first main surface 252 in such a way as to be contact with one end of the non-fully substitutional solid solution 260 that forms the embedded electrode.

Through the aforementioned process steps, a structure (embedded electrode structure) including the embedded electrode constituted by the non-fully substitutional solid solution 260 is formed in the opening 251 of the substrate 250, and the electric wiring layer 265 electrically connected to this embedded electrode are formed.

Third Embodiment

FIG. 3 shows a method of forming an embedded electrode according to a third embodiment of the present invention. This embodiment is a case where a multilayer wiring is used in the aforementioned second embodiment. Accordingly, the reference numerals used in FIGS. 2A and 2B showing the second embodiment are denoted to the same constituting elements in FIG. 3.

First, as shown in FIG. 3(a), a transistor 70 is formed on the side of a second major surface 253 (lower surface in this drawing) of a substrate 250 such as a semiconductor wafer by a known method. The transistor 70 comprises a gate electrode 72, and a pair of the diffusion layers 71 disposed at each side of the gate electrode 72. Wiring layers 73a, 73b, and 73c are connected to one of the pair of diffusion layers 71. The gate electrode 72 and the wiring layers 73a, 73b, and 73c are disposed in an insulating layer 74 (which is usually an oxide film). Interlayer wiring layers 270 are formed among the wiring layers 73a, 73b, and 73c. One of the interlayer wiring layers 270 connects electrically the adjacent wiring layers 73a and 73b. Such the wiring layers and the interlayer wiring layers as described here are heavily used in silicon integrated circuits.

Next, as shown in FIG. 3(b), in the same way as the above second embodiment, an opening 251b for forming an embodied electrode that reaches the second wiring layer 73b is formed in the substrate 250. Thereafter, an embedded electrode is formed in the opening 251b in the same way as the above second embodiment.

In FIG. 3, the case of forming an embedded electrode to the second wiring layer 73b is shown; however, the present invention is not limited thereto. Another embedded electrode to the other wiring layer may be formed. In FIG. 3(c), an opening 251c for forming an embedded electrode to the third wiring layer 73c is shown. Thus, with a multilayer wiring structure, it is possible to form an embedded electrode to any wiring layer as designated.

In FIG. 3(d), an opening 251bc for forming an embedded electrode commonly to the second and third wiring layers 73b and 73c is shown. If an embedded electrode is formed for such the configuration, an interlayer wiring layer for the second and third wiring layers 73b and 73c is formed and at the same time, these two wiring layers 73b and 73c can be drawn to the side of the first major surface 252. That is, it is possible to impart multiple functions to one embedded electrode.

Fourth Embodiment

FIGS. 6A to 6H show examples of a conductive particle to be used for a method of forming a through/embedded electrode according to a fourth embodiment of the present invention and a bonding structure (connecting state) among the various conductive particles. A variety of conductive particles which will be explained below with reference to FIGS. 6A to 6H can be used for the porous sintered body 257 or the non-fully substitutional solid solution 260 according to the aforementioned second and third embodiments.

Figure 6A:
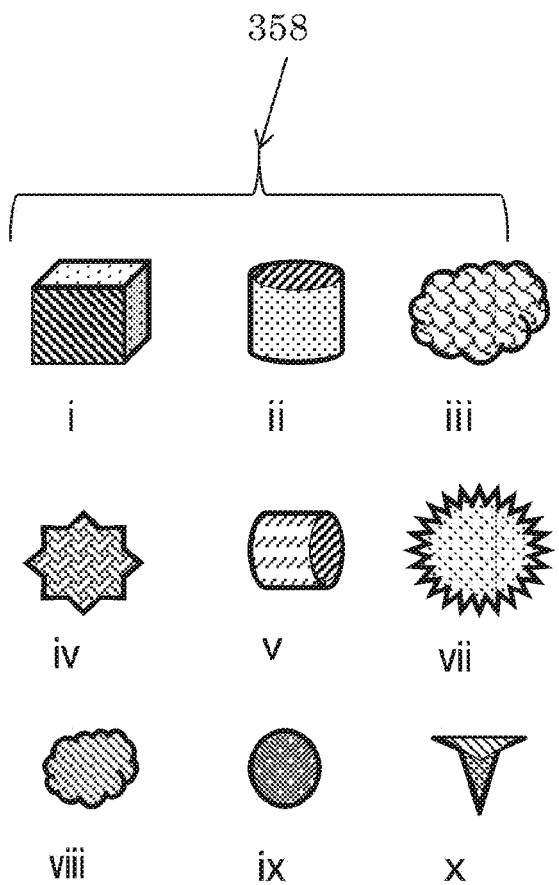
FIG. 6A is an explanatory drawing showing examples of a polyhedron particle (a conductive particle of polyhedron) to be used for a method of forming a through/embedded electrode according to a fourth embodiment of the present invention.

FIG. 6A shows examples of a polyhedron particle (a conductive particle of polyhedron) to be used for a method of forming a through/embedded electrode according to a fourth embodiment of the present invention. These polyhedron particles may be replaced with the porous sintered body 57 or the conductive particles 58 for the non-fully substitutional solid solution 60 according to the above first embodiment.

The polyhedron particles (conductive particles of polyhedron) 358 exemplified here are (i) like a rectangular parallelepiped, (ii) cylindrical, (iii) approximately ellipsoidal to have protrusions on its surface, (iv) approximately spherical to have protrusions on its surface (v) cylindrical, (vii) spherical to have protrusions on its surface (viii) approximately ellipsoidal to have protrusions on its surface, (ix) spherical, and (x) like a star. Other shapes than these examples may be used. In this way, the conducive particles 358 may have a various shape.

The polyhedron particle (conductive particle of polyhedron) 358 may be made of a metal or alloy, or a conductor other than metals and alloys, in which only a core is present and a thin film (skin) is not present. The particle 358 may be formed by a core made of an organic or inorganic material and a conductive thin film (skin) (e.g., a metal film) formed on the surface of the core.

Figure 6B:
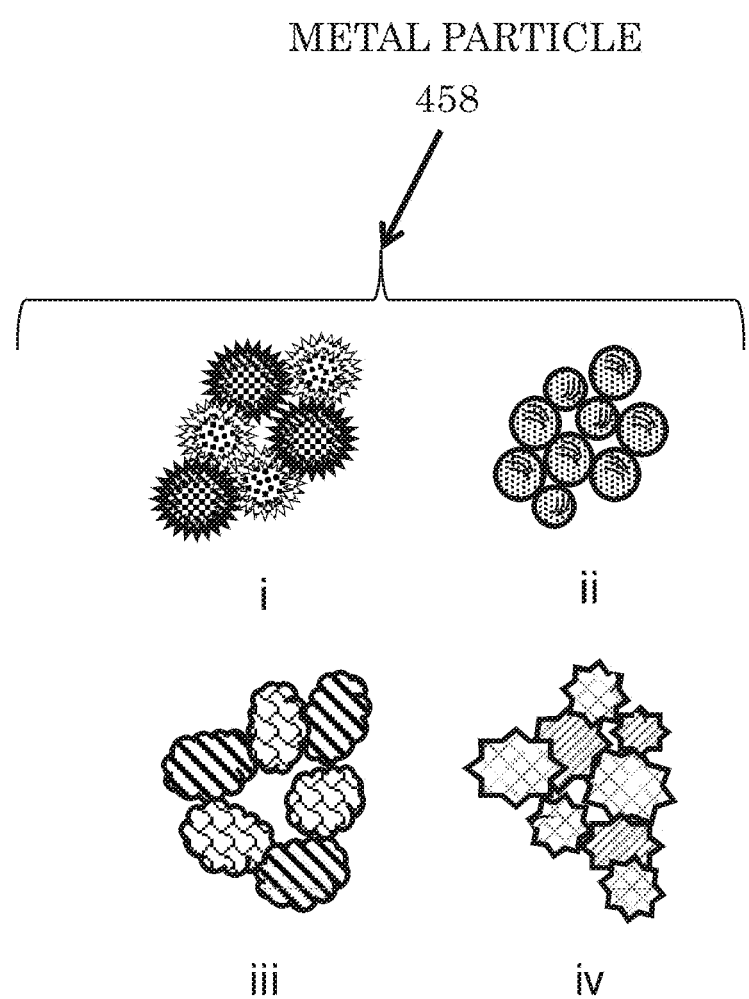
FIG. 6B is an explanatory drawing showing examples of a metal particle (a conductive particle made of metal) to be used for the method of forming a through/embedded electrode according to the fourth embodiment of the present invention.

FIG. 6B shows examples of a metal particle (a conductive particle made of metal) 458. The metal particle 458 exemplified here may be formed, for example, by preparing a fine particle made of W, Mo, or Si as a core and by covering a conductive thin film (skin) made of Ni, Cu, Sn, Au, or Ag the surface of the core thus prepared by plating or the like. Here, four examples (i) to (iv) of the shape of the particle 458 are shown.

Figure 6C:
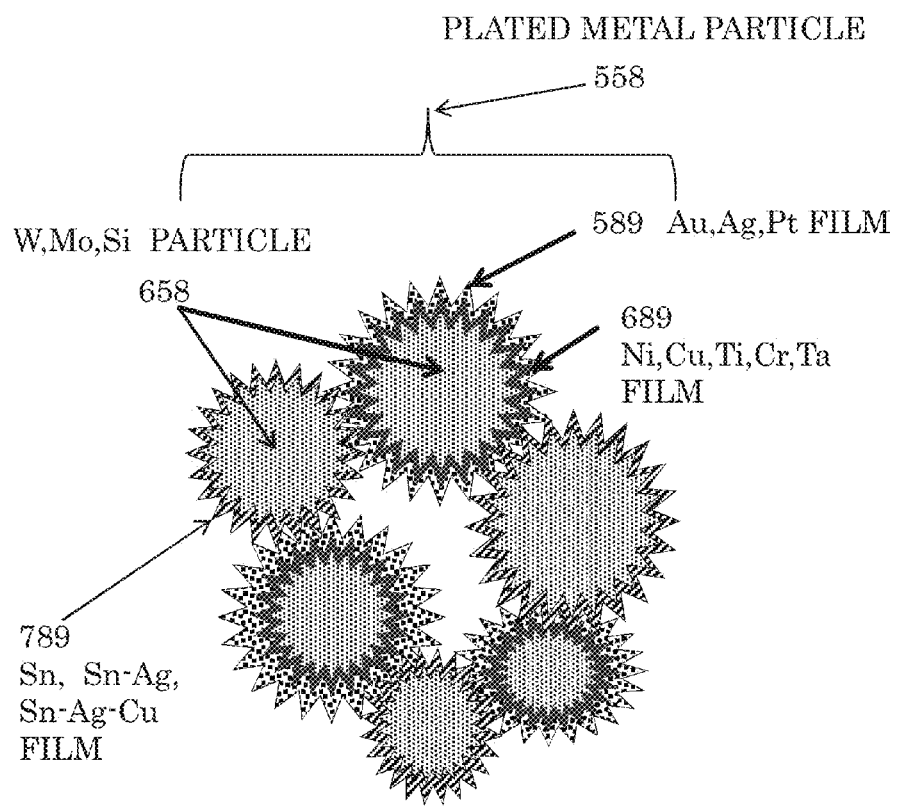
FIG. 6C is an explanatory drawing showing examples of a plated metal particle (a conductive particle made of plated metal) to be used for the method of forming a through/embedded electrode according to the fourth embodiment of the present invention.

FIG. 6C shows examples of a plated metal particle (a conductive particle made of plated metal) 558.

The reference numeral 658 denotes a fine particle made of W, Mo, or Si and is used as the core of the plated metal particle 558. The reference numeral 589 denotes a thin film (skin) (conductive film) made of Au, Ag, or Pt (which has a comparatively high melting point) disposed at the outermost position of the particle 658 serving as the core. The reference numeral 689 denotes a thin film (skin) (conductive film) made of Ni, Cu, Ti, Cr, or Ta (which has a comparatively high melting point) disposed inside the thin film (skin) 589, i.e., between the core particle 658 and the film 589. The reference numeral 789 denotes a thin film (skin) (conductive film) made of Sn, a Sn—Ag alloy, or a Sn—Ag—Cu alloy (which have a comparatively low melting point) formed to cover the surface of the particle 658 serving as the core.

Accordingly, one of the two plated metal particles 558 comprises the particle 658 made of W, Mo, or Si serving as the core, the film (skin) 689 made of Ni, Cu, Ti, Cr, or Ta formed to cover the surface of the core 658, and the thin film (skin) 589 made of Au, Ag, or Pt formed to cover the surface of the film 689. In other words, this plated metal particle 558 comprises the two different metal films (skins) 589 and 689 which have comparatively high melting points.

Moreover, the other of the two plated metal particles 558 comprises the particle 658 made of W, Mo, or Si serving as the core, and the film (skin) 789 made of Sn, Sn—Ag alloy, or Sn—Ag—Cu alloy (which has a comparatively low melting point) formed to cover the surface of the core 658. In other words, this plated metal particle 558 comprises the metal film (skin) 789 which has a comparatively low melting point.

It is preferred that the two plated metal particles 558 shown in FIG. 6C are used together (used simultaneously). For example, W is selected for the core particle 658; then, the two plated metal particles 558 comprising the metal films 589 and 689 having comparatively high melting points that cover the core particles (W), respectively, is used as the "first conductive particle", and the plated metal particle 558 comprising the metal film 789 having a comparatively low melting point that covers the core particle (W) is used as the "second conductive particle". The first and second conductive particles thus prepared are mixed together, thereby generating the paste 56 containing the first conductive material. By using these two conductive particles together in this way, a porous sintered body (a through/embedded electrode) having similar characteristics to those of a sintered body formed by tungsten (W) particles only whose sintering temperature is 1100° C. or higher can be produced at a temperature of 300° C. or lower. Thus, this method has a large significance at this point.

Figure 6D:
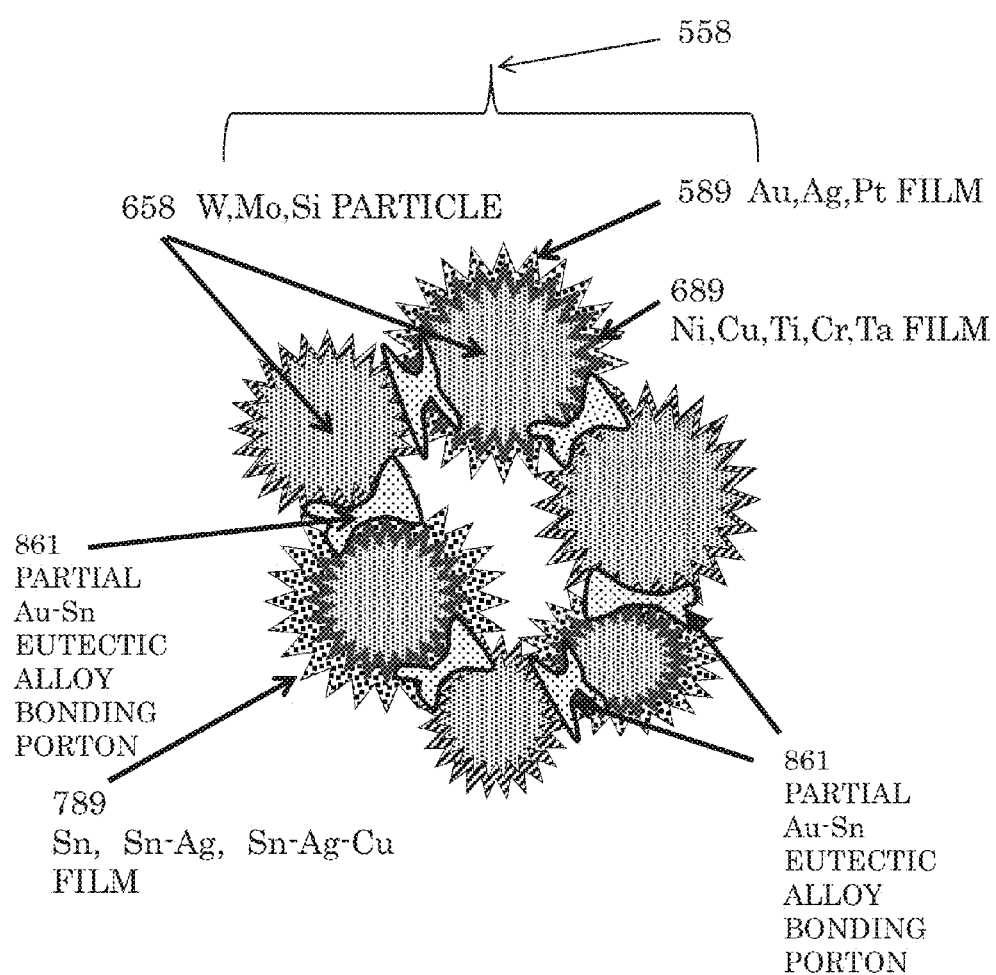
FIG. 6D is an explanatory drawing showing other examples of a plated metal particle (a conductive particle made of metal plating) to be used for the method of forming a through/embedded electrode according to the fourth embodiment of the present invention.

FIG. 6D shows other examples of the plated metal particle (conductive particle made of metal) 558 shown in FIG. 6C. The particles 558 shown in FIG. 6D are obtained by, for example, decreasing the sizes of the plated metal particles 558 shown in FIG. 6C and then, they are sintered in a reducing atmosphere using hydrogen or nitrogen at a comparatively low temperature from 200° C. to 250° C., thereby forming bonding portions 861 made of partial Au—Sn eutectic alloy due to inter-diffusion or the like.

In this example shown in FIG. 6D, the plated metal particle 558 comprising the core particle 658 made of W, Mo, or Si, the film (skin) 689 made of Ni, Cu, Ti, Cr, or Ta, and the thin film (skin) 589 made of Au, Ag, or Pt; and the plated metal particle 558 comprising the core particle 658 made of W, Mo, or Si, and the film (skin) 789 made of Sn, Sn—Ag alloy, or Sn—Ag—Cu alloy are used in combination. Moreover, at the respective bonding portions 861 between these two plated metal particles 558, the mesh-like bonding portions 861 made of partial Au—Sn eutectic alloy are formed. Because the melting point of the bonding portion 861 is 275° C. or higher, there is an advantage that desired strength of the through/embedded electrode can be sufficiently maintained by limiting the processing temperature to a level of the load temperature of 265° C. in the mounting process of semiconductor devices or low.

Figure 6E:
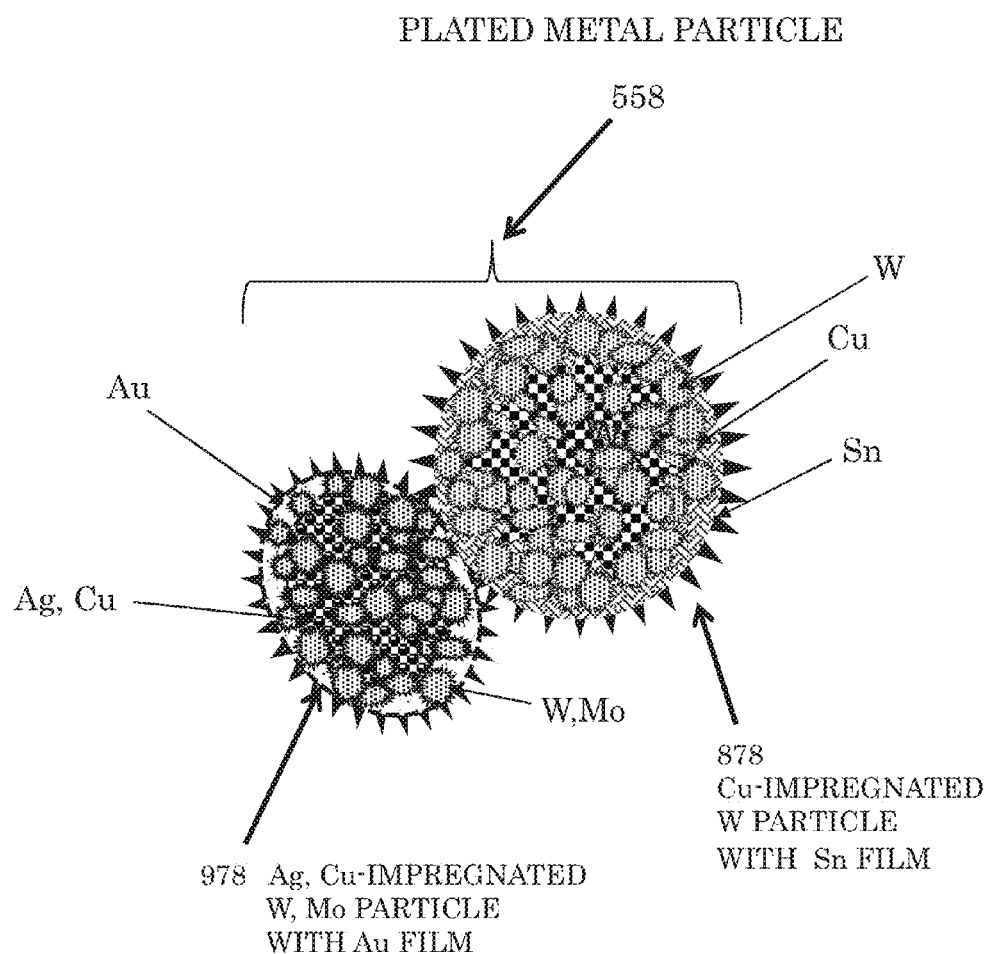
FIG. 6E is an explanatory drawing showing still other examples of a plated metal particle (a conductive particle made of metal plating) to be used for the method of forming a through/embedded electrode according to the fourth embodiment of the present invention.

FIG. 6E shows still other examples of the plated metal particle (a conductive particle made of metal) 558.

The reference numeral 878 denotes a metal particle comprising a polyhedron particle made of W which is impregnated with Cu serving as the core, and a Sn film (skin) formed to cover the surface of the core.

The reference numeral 978 denotes a metal particle comprising a polyhedron particle made of W or Mo which is impregnated with Ag or Cu serving as the core, and a Au film (skin) formed to cover the surface of the core. If the metal particle 558 is formed by using the polyhedron W core particle impregnated with Cu described here, electrical conductivity and thermal conductivity are improved compared with the case where only the polyhedron W particle is used. Therefore, if a porous sintered body (through/embedded electrode) is formed by using the metal particles 878 and 978 described here, this sintered body (through/embedded electrode) has a thermal expansion coefficient close to that of tungsten (W) under the condition that the Cu content of the sintered body is 60 w % or lower.

Figure 6F:
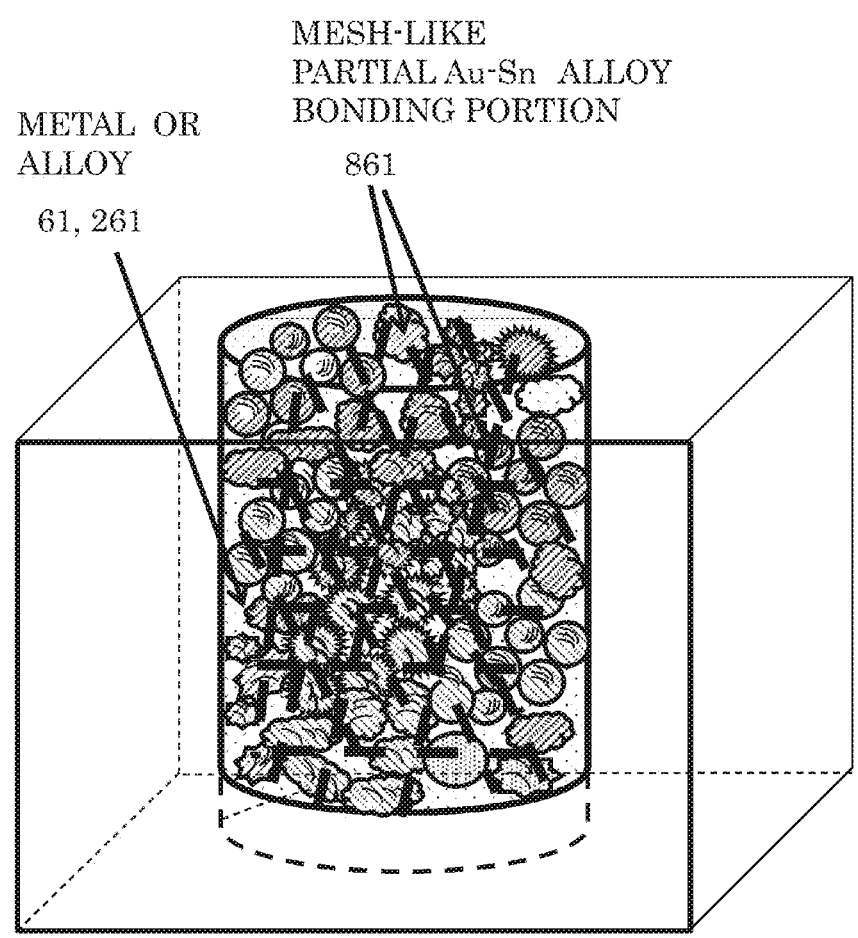
FIG. 6F is an explanatory drawing showing an example of the state of the respective particles in the through/embedded electrode to be formed by the method of forming a through/embedded electrode according to the fourth embodiment of the present invention.
Figure 6G:
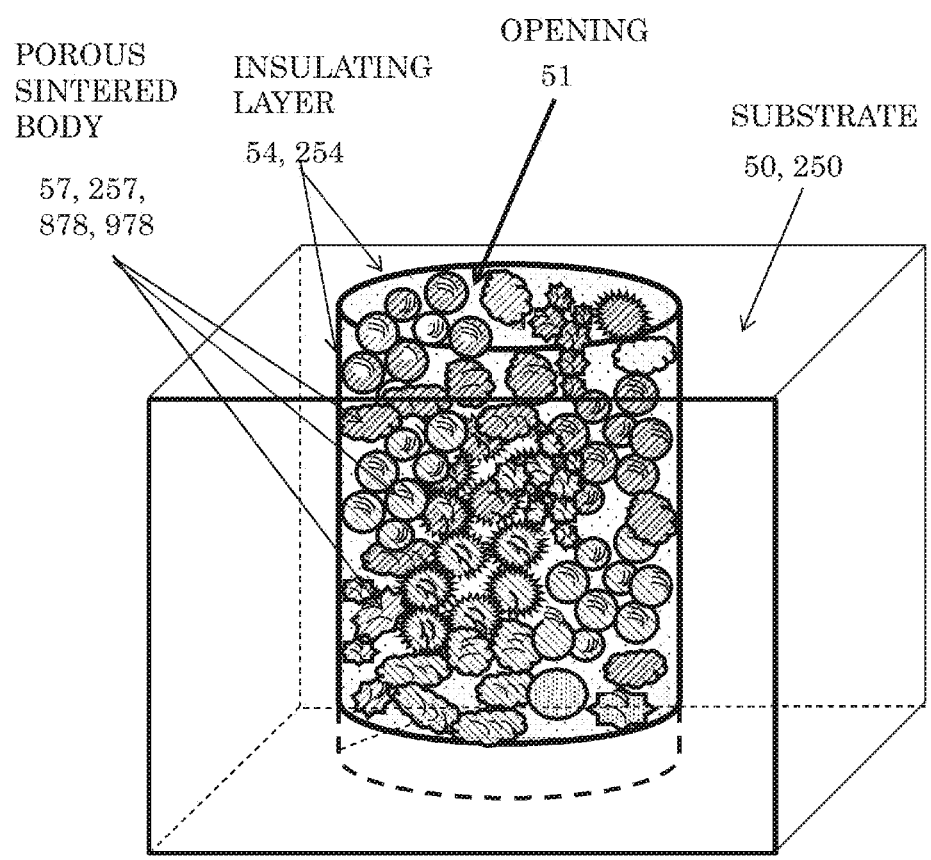
FIG. 6G is an explanatory drawing showing another example of the state of the respective particles in the through/embedded electrode to be formed by the method of forming a through/embedded electrode according to the fourth embodiment of the present invention.

FIGS. 6F and 6G show an example of the state of the respective particles in the through/embedded electrode according to the present invention.

The porous sintered body 57 or 257 constituting the through/embedded electrode is filled in the opening 51 or 251, and the electrical connection along the thickness direction of the substrate 50 or 250 (vertical direction in FIGS. 6F and 6G) is realized. By taking such the configuration, a thermal expansion coefficient difference between the porous sintered body 57 or 257 constituting the through/embedded electrode and the substrate 50 or 250 made of silicon or the like can be kept small; therefore, the through/embedded electrode and/or the substrate c50 or 250 can be prevented from being broken in the opening 51 or 251 due to stress. Furthermore, the electrical resistance of the through/embedded electrode can be lowered and the heat dissipation characteristic by way of the through/embedded electrode can be improved, FIG. 6H shows schematically the internal structure of the through/embedded electrode shown in FIG. 6D. The through/embedded electrode shown in FIG. 6H includes the metal particle 558 comprising the core 658 made of W, Mo, or Si, the film (skin) 689 made of Ni, Cu, Ti, Cr, or Ta covering the surface of the core 658, and the thin film (skin) 589 made of Au, Ag, or Pt covering the surface of the film 689; and the metal particle 558 comprising the core 658 made of W, Mo, or Si, and the film (skin) 789 made of Sn, Sn—Ag alloy, or Sn—Ag—Cu alloy covering the surface of the core 658. As shown in FIG. 6H, the base material of the porous sintered body (through/embedded electrode) is generated by the formation of the mesh-like bonding portions 861 made of partial Au—Sn eutectic alloy, and the gaps or vacancies dispersed in the base material are filled with the molten material 61 or 261 of indium or indium-based alloy.

As explained above, with the method of forming a through/embedded electrode according to the fourth embodiment of the present invention, the first conductive particles 558 having the core particle 658 (e.g., W particle) and the two metal films 589 and 689 whose melting points are comparatively low that cover the surface of the core particle 658, and the second conductive particles 558 having the core particle 658 (e.g., W particle) and the metal film 789 whose melting point is comparatively high that covers the surface of the core particle 658 are prepared and mixed together. By using the mixture of the first and second conductive particles 558, the mesh-like bonding portions 861 made of partial Au—Sn eutectic alloy can be formed. As a result, an electrode structure having good electrical conductivity, and a low thermal resistance characteristic and a low thermal expansion characteristic due to good thermal dissipation and good thermal conductivity can be obtained.

Moreover, since a pseudo sintering body can be produced at a temperature of 300° C. or lower, strong bonding portions can be formed between the conductive particles at a temperature of 275° C. Therefore, similar characteristics to a sintered body of W can be maintained. As a result, an electrode or electrode structure whose resistance against the mounting process of electronic components is high can be realized.

With the present invention, the reliability and the signal transmission characteristic of the through/embedded electrode can be improved drastically. By this improvement, placement of the through/embedded electrodes in a higher density can be realized according to the miniaturization of the semiconductor manufacturing technology.

Here, an explanation about the conductive particles shown in FIGS. 6A to 6H, i.e., the materials to be used for the through/embedded electrode (electrode material) according to the present invention will be added as follows:

(1) About the particles 458 shown in FIG. 6B, where a single film (skin) is formed to cover the surface of a core:

The particle which can be used as the core is a semiconductor particle other than Si, an alloy particle made of an alloy such as Inconel (Ni—Cr—Fe alloy), a ceramic particle made of SiC, AlN or the like, an inorganic material particle made of brosilicic acid glass, TEMPAX glass, EAGLE glass, or the like, an organic material particle made of polyimide denatured material or the like may be used in addition to W, Mo, or Si as described above. A mixture of an organic material particle and an inorganic material particle may be used.

The conductive material which can be used as the thin film (skin) is Pd, Co, Cr, Cu—Cn, Ni—Au, Zn and Al in addition to Ni, Cu, Sn, Au and Ag as described above.

(2) About the particles 558 shown in FIG. 6C, where two different metal films 589 and 689 having comparatively high melting points are formed:

The particle which can be used as the core 658 is the same as those for the particles 458 shown in FIG. 6B.

The material which can be used for the metal film 589 having a comparatively high melting point disposed at the outermost position is Pd, Cu or an alloy of Pd or Cu. In addition to Au, Ag, or Pt as described above.

The material which can be used for the metal film 689 having a comparatively high melting point disposed between the core 658 and the metal film 589 is Pd or Co in addition to Ni, Cu, Ti, Cr, or Ta as described above.

(3) About the particles 558 shown in FIG. 6C, where a metal film 789 having a comparatively low melting point is formed:

The particle which can be used as the core 658 is the same as those for the particles 458 shown in FIG. 6B.

The material which can be used for the metal film 789 is Zn, Bi, Ga, Pb, Cu—Sn, or an alloy of these elements in addition to Sn, Sn—Ag, or Sn—Ag—Cu as described above.

(4) About the particles 878 shown in FIG. 6E, where a Sn film (skin) is formed to cover the surface of a Cu-impregnated W particle:

The particle which can be used as the core 658 is the same as those for the particles 458 shown in FIG. 6B.

The material for impregnation is Ag, Zn, Al, Ni, or Cd in addition to Cu described above.

The material which can be used for the film (skin) is Zn, Cu, Cd, Cu—Sn, Cu—Sn—Ag, or an alloy f these elements in addition to Sn as described above.

(5) About the particles 978 shown in FIG. 6E, where a Au film (skin) is formed to cover the surface of a W or Mo particle impregnated with Ag or Cu:

The particle which can be used as the core is the same as those for the particles 458 shown in FIG. 6B.

The material for impregnation is Ag, Zn, Al, Ni, or Cd in addition to Ag or Cu described above.

The material which can be used for the film (skin) is Ag, Pt, Pd, Zn, Cu, Cu—Sn, Cu—Sn—Ag in addition to Au as described above.

INDUSTRIAL APPLICABILITY

The through/embedded electrode and a method of forming the same according to the present invention are basic techniques, in the semiconductor field, in particular, a three-dimensional stacking structure. Therefore, the present invention is applicable not only to through electrodes and embedded electrodes but also to three-dimensional integrated circuits (e.g., memory circuits, arithmetic processing circuits, driver circuits, etc.) and sensor systems.

VARIATIONS

The above-described first to fourth embodiments are embodied examples of the present invention. Therefore, it is needless to say that the present invention is not limited to these embodiments and any other modification is applicable to these embodiments without departing the spirit of the present invention.

What is claimed is:

1. A through/embedded electrode structure comprising:
a substrate having an opening; and
a through/embedded electrode formed in the opening of the substrate;
wherein the electrode comprises:
a first porous conductor formed by a sintered body, wherein the sintered body is formed by sintering a paste including conductive particles of a first conductive material at a temperature less than 300° C. in such a way as to form consecutive gaps among the particles in the sintered body; and
a second conductor embedded into the gaps of the sintered body, formed by embedding and curing a second conductive material into the gaps of the first conductor;
wherein the second conductive material is different from the first conductive material;
the second conductive material is made of a metal or alloy having a melting point lower than a sintering temperature of the first conductive material,
wherein the second conductor embedded into the gaps form conductive paths in the first conductor, and
wherein each of the particles of the first conductive material includes a core and a conductive film formed on the surface of the core as a skin thereof.

2. The through/embedded electrode structure according to claim 1, wherein the conductive films of the first conductive material are contacted and interconnected with each other to form three-dimensional consecutive paths.

3. A through/embedded electrode structure comprising:
a substrate having an opening; and
a through/embedded electrode formed in the opening of the substrate;
wherein the electrode comprises:
a first porous conductor formed by a sintered body, wherein the sintered body is formed by sintering a paste including conductive particles of a first conductive material at a temperature less than 300° C. in such a way as to form consecutive gaps among the particles in the sintered body; and
a second conductor embedded into the gaps of the sintered body, formed by embedding and curing a second conductive material into the gaps of the first conductor;
wherein the second conductive material is different from the first conductive material;
the second conductive material is made of a metal or alloy having a melting point lower than a sintering temperature of the first conductive material,
wherein the second conductor embedded into the gaps form conductive paths in the first conductor,
wherein the second conductive material includes conductive particles of a second conductive material;
and wherein each of the particles of the second conductive material includes a core and a conductive film formed on the surface of the core as a skin thereof.

4. A through/embedded electrode structure comprising:
a substrate having an opening; and
a through/embedded electrode formed in the opening of the substrate;
wherein the electrode comprises:
a first porous conductor formed by a sintered body, wherein the sintered body is formed by sintering a paste including conductive particles of a first conductive material at a temperature less than 300° C. in such a way as to form consecutive gaps among the particles in the sintered body; and
a second conductor embedded into the gaps of the sintered body, formed by embedding and curing a second conductive material into the gaps of the first conductor;

wherein the second conductive material is different from the first conductive material;

the second conductive material is made of a metal or alloy having a melting point lower than a sintering temperature of the first conductive material, wherein the second conductor embedded into the gaps form conductive paths in the first conductor, and wherein the first conductive material includes first conductive particles and second conductive particles as the conductive particles;

and wherein each of the first conductive particles comprises a first core and a first conductive film formed on the surface of the first core as a skin thereof, and each of the second conductive particles comprises a second core and a second conductive film formed on the surface of the second core as a skin thereof;

and wherein the first conductive film and the second conductive film are different in melting temperature from each other.

5. A through/embedded electrode structure comprising:

a substrate having an opening; and a through/embedded electrode formed in the opening of the substrate;

wherein the electrode comprises:

a first porous conductor formed by a sintered body, wherein the sintered body is formed by sintering a paste including conductive particles of a first conductive material at a temperature less than 300° C. in such a way as to form consecutive gaps among the particles in the sintered body; and a second conductor embedded into the gaps of the sintered body, formed by embedding and curing a second conductive material into the gaps of the first conductor;

wherein the second conductive material is different from the first conductive material;

the second conductive material is made of a metal or alloy having a melting point lower than a sintering temperature of the first conductive material, wherein the second conductor embedded into the gaps form conductive paths in the first conductor, and wherein each of the conductive particles of the first conductive material comprises a core, a first conductive film formed on the surface of the core as a skin thereof, and a second conductive film formed on the first conductive film as another skin thereof;

and wherein the first conductive film and the second conductive film are different in melting temperature from each other.

6. A through/embedded electrode structure comprising:

a substrate having an opening; and a through/embedded electrode formed in the opening of the substrate;

wherein the electrode comprises:

a first porous conductor formed by a sintered body, wherein the sintered body is formed by sintering a paste including conductive particles of a first conductive material at a temperature less than 300° C. in such a way as to form consecutive gaps among the particles in the sintered body; and a second conductor embedded into the gaps of the sintered body, formed by embedding and curing a second conductive material into the gaps of the first conductor;

wherein the second conductive material is different from the first conductive material;

the second conductive material is made of a metal or alloy having a melting point lower than a sintering temperature of the first conductive material, wherein the second conductor embedded into the gaps form conductive paths in the first conductor, and wherein partial eutectic alloy bonding portions are formed among the conductive particles of the first conductive material.

* * * * *